United States Patent
Albert et al.

(10) Patent No.: US 7,242,513 B2
(45) Date of Patent: Jul. 10, 2007

(54) ENCAPSULATED ELECTROPHORETIC DISPLAYS HAVING A MONOLAYER OF CAPSULES AND MATERIALS AND METHODS FOR MAKING THE SAME

(75) Inventors: Jonathan D. Albert, Cambridge, MA (US); Glen Crossley, Belmont, MA (US); Katharine Geramita, Cambridge, MA (US); Karl R. Amundson, Cambridge, MA (US); Michael L. Steiner, Methuen, MA (US); Paul Drzaic, Lexington, MA (US); Andrew Loxley, Allston, MA (US); Barrett Comiskey, Cambridge, MA (US); Peter J. Valianatos, Boston, MA (US)

(73) Assignee: E Ink Corporation, Cambridge, MA (US)

( * ) Notice: Subject to any disclaimer, the term of this patent is extended or adjusted under 35 U.S.C. 154(b) by 579 days.

(21) Appl. No.: 10/851,706

(22) Filed: May 20, 2004

(65) Prior Publication Data

US 2004/0217929 A1 Nov. 4, 2004

Related U.S. Application Data

(63) Continuation of application No. 09/413,444, filed on Oct. 6, 1999, now Pat. No. 6,839,158, which is a continuation-in-part of application No. 09/300,585, filed on Apr. 27, 1999, now Pat. No. 6,130,774, said application No. 09/413,444 is a continuation-in-part of application No. 09/141,105, filed on Aug. 27, 1998, now Pat. No. 6,067,185.

(60) Provisional application No. 60/118,794, filed on Feb. 4, 1999, provisional application No. 60/103,398, filed on Oct. 7, 1998, provisional application No. 60/093,689, filed on Jul. 22, 1998, provisional application No. 60/085,096, filed on May 12, 1998, provisional application No. 60/083,252, filed on Apr. 27, 1998, provisional application No. 60/078,363, filed on Mar. 18, 1998, provisional application No. 60/076,978, filed on Mar. 5, 1998, provisional application No. 60/076,957, filed on Mar. 5, 1998, provisional application No. 60/076,959, filed on Mar. 5, 1998, provisional application No. 60/076,955, filed on Mar. 5, 1998, provisional application No. 60/074,454, filed on Feb. 12, 1998, provisional application No. 60/071,371, filed on Jan. 15, 1998, provisional application (Continued)

(51) Int. Cl.
*G02B 26/00* (2006.01)
*G09G 3/34* (2006.01)
*G03G 17/04* (2006.01)

(52) U.S. Cl. .................... 359/296; 345/107; 430/32
(58) Field of Classification Search ........ 359/295–296; 345/107
See application file for complete search history.

(56) References Cited

U.S. PATENT DOCUMENTS 2,800,457 A 7/1957 Green et al. ............. 428/402.2

(Continued)

OTHER PUBLICATIONS

U.S. Appl. No. 08/820,057, filed Mar. 18, 1997, Turner et al.

(Continued)

*Primary Examiner*—Scott J. Sugarman
*Assistant Examiner*—DaWayne A. Pinkney
(74) *Attorney, Agent, or Firm*—David J. Cole

(57) ABSTRACT

An encapsulated electrophoretic display having a plurality of non-spherical capsules disposed substantially in a single layer on a substrate.

33 Claims, 6 Drawing Sheets

Related U.S. Application Data

No. 60/070,935, filed on Jan. 9, 1998, provisional application No. 60/070,939, filed on Jan. 9, 1998, provisional application No. 60/072,390, filed on Jan. 9, 1998, provisional application No. 60/070,940, filed on Jan. 9, 1998, provisional application No. 60/066,418, filed on Nov. 24, 1997, provisional application No. 60/066,334, filed on Nov. 21, 1997, provisional application No. 60/066,115, filed on Nov. 21, 1997, provisional application No. 60/066,246, filed on Nov. 20, 1997, provisional application No. 60/066,245, filed on Nov. 20, 1997, provisional application No. 60/066,147, filed on Nov. 19, 1997, provisional application No. 60/065,605, filed on Nov. 18, 1997, provisional application No. 60/065,630, filed on Nov. 18, 1997, provisional application No. 60/059,358, filed on Sep. 19, 1997, provisional application No. 60/057,118, filed on Aug. 28, 1997, provisional application No. 60/057,798, filed on Aug. 28, 1997, provisional application No. 60/057,122, filed on Aug. 28, 1997, provisional application No. 60/057,163, filed on Aug. 28, 1997, provisional application No. 60/057,799, filed on Aug. 28, 1997, provisional application No. 60/057,716, filed on Aug. 28, 1997, provisional application No. 60/057,133, filed on Aug. 28, 1997.

(56) References Cited

U.S. PATENT DOCUMENTS

| | | | |
|---|---|---|---|
| 3,036,388 A | 5/1962 | Tate | 434/409 |
| 3,384,488 A | 5/1968 | Tulagin et al. | 430/32 |
| 3,406,363 A | 10/1968 | Tate | 335/302 |
| 3,460,248 A | 8/1969 | Tate | 29/607 |
| 3,585,381 A | 6/1971 | Hodson et al. | 250/47 |
| 3,612,758 A | 10/1971 | Evans et al. | 178/5.4 |
| 3,658,675 A * | 4/1972 | Jones et al. | 430/32 |
| 3,668,106 A | 6/1972 | Ota | 204/299 |
| 3,670,323 A | 6/1972 | Sobel et al. | 340/324 |
| 3,756,693 A | 9/1973 | Ota | 350/160 |
| 3,767,392 A | 10/1973 | Ota | 96/1 |
| 3,772,013 A | 11/1973 | Wells | 96/1.3 |
| 3,792,308 A | 2/1974 | Ota | 315/150 |
| 3,806,893 A | 4/1974 | Ohnishi et al. | 340/173 |
| 3,850,627 A | 11/1974 | Wells et al. | 96/1.3 |
| 3,867,141 A * | 2/1975 | Bergfjord et al. | 430/37 |
| 3,870,517 A | 3/1975 | Ota et al. | |
| 3,892,568 A * | 7/1975 | Ota | 430/19 |
| 3,909,116 A | 9/1975 | Kohashi | |
| 3,915,702 A * | 10/1975 | Bergfjord et al. | 430/31 |
| 3,922,255 A | 11/1975 | Koestler et al. | |
| 3,972,040 A | 7/1976 | Hilsum et al. | |
| 4,001,140 A | 1/1977 | Foris et al. | |
| 4,041,481 A | 8/1977 | Sato | |
| 4,045,327 A | 8/1977 | Noma et al. | |
| 4,062,009 A | 12/1977 | Raverdy et al. | |
| 4,068,927 A | 1/1978 | White | |
| 4,071,430 A | 1/1978 | Liebert | |
| 4,087,376 A | 5/1978 | Foris et al. | |
| 4,088,395 A | 5/1978 | Giglia | |
| 4,093,534 A | 6/1978 | Carter et al. | |
| 4,104,520 A | 8/1978 | Lewis et al. | |
| 4,123,346 A | 10/1978 | Ploix | |
| 4,126,528 A | 11/1978 | Chiang | |
| 4,126,854 A | 11/1978 | Sheridon | |
| 4,143,103 A | 3/1979 | Sheridon | |
| 4,143,472 A | 3/1979 | Murata et al. | |
| 4,147,932 A | 4/1979 | Lewis | |
| 4,149,149 A | 4/1979 | Miki et al. | |
| 4,166,800 A | 9/1979 | Fong | |
| 4,196,437 A | 4/1980 | Hertz | |
| 4,201,691 A | 5/1980 | Asher et al. | |
| 4,203,106 A | 5/1980 | Dalisa et al. | |
| 4,211,668 A | 7/1980 | Tate | |
| 4,218,302 A | 8/1980 | Dalisa et al. | |
| 4,231,641 A | 11/1980 | Randin | |
| 4,261,653 A | 4/1981 | Goodrich | |
| 4,272,596 A | 6/1981 | Harbour et al. | |
| 4,273,672 A | 6/1981 | Vassiliades | |
| 4,285,801 A | 8/1981 | Chiang | |
| 4,287,337 A | 9/1981 | Guglielmetti et al. | |
| 4,298,448 A | 11/1981 | Müller et al. | |
| 4,305,807 A | 12/1981 | Somlyody | |
| 4,311,361 A | 1/1982 | Somlyody | |
| 4,314,013 A | 2/1982 | Chang | |
| 4,324,456 A | 4/1982 | Dalissa | |
| 4,368,952 A | 1/1983 | Murata et al. | |
| 4,390,403 A | 6/1983 | Batchelder | |
| 4,418,346 A | 11/1983 | Batchelder | |
| 4,419,383 A | 12/1983 | Lee | |
| 4,430,648 A | 2/1984 | Togashi et al. | |
| 4,438,160 A | 3/1984 | Ishikawa et al. | |
| 4,439,507 A | 3/1984 | Pan et al. | |
| 4,444,961 A | 4/1984 | Timm | |
| 4,450,440 A | 5/1984 | White | |
| 4,502,934 A | 3/1985 | Gazard et al. | |
| 4,522,472 A | 6/1985 | Liebert et al. | |
| 4,543,306 A | 9/1985 | Dubois et al. | |
| 4,598,960 A | 7/1986 | DiSanto et al. | |
| 4,605,284 A | 8/1986 | Fergason | |
| 4,620,916 A | 11/1986 | Zwemer et al. | |
| 4,623,706 A | 11/1986 | Timm et al. | |
| 4,643,528 A | 2/1987 | Bell, Jr. | |
| 4,648,956 A | 3/1987 | Marshall et al. | |
| 4,655,897 A | 4/1987 | DiSanto et al. | |
| 4,666,673 A | 5/1987 | Timm | |
| 4,707,080 A | 11/1987 | Fergason | |
| 4,726,662 A | 2/1988 | Cromack | |
| 4,732,830 A | 3/1988 | DiSanto et al. | |
| 4,741,604 A | 5/1988 | Kornfeld | |
| 4,742,345 A | 5/1988 | DiSanto et al. | |
| 4,746,917 A | 5/1988 | DiSanto et al. | |
| 4,748,366 A | 5/1988 | Taylor | |
| 4,772,102 A | 9/1988 | Fergason et al. | |
| 4,824,208 A | 4/1989 | Fergason et al. | |
| 4,832,458 A | 5/1989 | Fergason et al. | |
| 4,833,464 A | 5/1989 | DiSanto et al. | |
| 4,846,931 A | 7/1989 | Gmitter et al. | |
| 4,850,919 A | 7/1989 | DiSanto et al. | |
| 4,883,561 A | 11/1989 | Gmitter et al. | |
| 4,889,603 A | 12/1989 | DiSanto et al. | |
| 4,891,245 A | 1/1990 | Micale | |
| 4,892,607 A | 1/1990 | DiSanto et al. | |
| 4,909,959 A | 3/1990 | Lemaire et al. | |
| 4,919,521 A | 4/1990 | Tada et al. | |
| 4,931,019 A | 6/1990 | Park | |
| 4,947,159 A | 8/1990 | DiSanto et al. | |
| 4,947,219 A | 8/1990 | Boehm | |
| 5,006,212 A | 4/1991 | DiSanto et al. | |
| 5,009,490 A | 4/1991 | Kouno et al. | |
| 5,017,225 A | 5/1991 | Nakanishi et al. | |
| 5,028,841 A | 7/1991 | DiSanto et al. | |
| 5,041,824 A | 8/1991 | DiSanto et al. | |
| 5,053,763 A | 10/1991 | DiSanto et al. | |
| 5,057,363 A | 10/1991 | Nakanishi | |
| 5,059,694 A | 10/1991 | Delabouglise et al. | |
| 5,066,105 A | 11/1991 | Yoshimoto et al. | |
| 5,066,559 A | 11/1991 | Elmasry et al. | |
| 5,066,946 A | 11/1991 | DiSanto et al. | |
| 5,070,326 A | 12/1991 | Yoshimoto et al. | |
| 5,077,157 A | 12/1991 | DiSanto et al. | |
| 5,082,351 A | 1/1992 | Fergason | |
| 5,099,256 A | 3/1992 | Anderson | |

| Patent | Date | Inventor |
|---|---|---|
| 5,105,185 A | 4/1992 | Nakanowatari et al. |
| 5,128,226 A | 7/1992 | Hung |
| 5,128,785 A | 7/1992 | Yoshimoto et al. |
| 5,132,049 A | 7/1992 | Garreau et al. |
| 5,138,472 A | 8/1992 | Jones et al. |
| 5,149,826 A | 9/1992 | Delabouglise et al. |
| 5,151,032 A | 9/1992 | Igawa |
| 5,161,007 A | 11/1992 | Takanashi et al. |
| 5,174,882 A | 12/1992 | DiSanto et al. |
| 5,177,476 A | 1/1993 | DiSanto et al. |
| 5,185,226 A | 2/1993 | Grosso et al. |
| 5,187,609 A | 2/1993 | DiSanto et al. |
| 5,194,852 A | 3/1993 | More et al. |
| 5,204,424 A | 4/1993 | Roncali et al. |
| 5,216,416 A | 6/1993 | DiSanto et al. |
| 5,216,530 A | 6/1993 | Pearlman et al. |
| 5,220,316 A | 6/1993 | DiSanto et al. |
| 5,223,115 A | 6/1993 | DiSanto et al. |
| 5,223,823 A | 6/1993 | DiSanto et al. |
| 5,233,459 A | 8/1993 | Bozler et al. |
| 5,238,861 A | 8/1993 | Morin et al. |
| 5,247,290 A | 9/1993 | DiSanto et al. |
| 5,250,932 A | 10/1993 | Yoshimoto et al. |
| 5,250,938 A | 10/1993 | DiSanto et al. |
| 5,254,981 A | 10/1993 | DiSanto et al. |
| 5,262,098 A | 11/1993 | Crowley et al. |
| 5,266,098 A | 11/1993 | Chun et al. |
| 5,266,937 A | 11/1993 | DiSanto et al. |
| 5,268,448 A | 12/1993 | Buechner et al. |
| 5,270,843 A | 12/1993 | Wang |
| 5,272,238 A | 12/1993 | Garnier et al. |
| 5,276,113 A | 1/1994 | Hashiguchi et al. |
| 5,276,438 A | 1/1994 | DiSanto et al. |
| 5,279,511 A | 1/1994 | DiSanto et al. |
| 5,279,694 A | 1/1994 | DiSanto et al. |
| 5,293,528 A | 3/1994 | DiSanto et al. |
| 5,296,974 A | 3/1994 | Tada et al. |
| 5,298,833 A | 3/1994 | Hou |
| 5,302,235 A | 4/1994 | DiSanto et al. |
| 5,303,073 A | 4/1994 | Shirota et al. |
| 5,304,439 A | 4/1994 | Disanto et al. |
| 5,315,312 A | 5/1994 | DiSanto et al. |
| 5,326,484 A | 7/1994 | Nakashima et al. |
| 5,344,594 A | 9/1994 | Sheridon |
| 5,345,251 A | 9/1994 | DiSanto et al. |
| 5,347,144 A | 9/1994 | Garnier et al. |
| 5,357,355 A | 10/1994 | Arai |
| 5,359,346 A | 10/1994 | DiSanto et al. |
| 5,360,689 A | 11/1994 | Hou et al. |
| 5,362,671 A | 11/1994 | Zavracky et al. |
| 5,380,362 A | 1/1995 | Schubert |
| 5,383,008 A | 1/1995 | Sheridon |
| 5,389,945 A | 2/1995 | Sheridon |
| 5,402,145 A | 3/1995 | DiSanto et al. |
| 5,403,518 A | 4/1995 | Schubert |
| 5,403,772 A | 4/1995 | Zhang et al. |
| 5,411,398 A | 5/1995 | Nakanishi et al. |
| 5,411,656 A | 5/1995 | Schubert |
| 5,412,398 A | 5/1995 | DiSanto et al. |
| 5,421,926 A | 6/1995 | Yukinobu et al. |
| 5,460,688 A | 10/1995 | DiSanto et al. |
| 5,463,492 A | 10/1995 | Check |
| 5,467,107 A | 11/1995 | DiSanto et al. |
| 5,498,674 A | 3/1996 | Hou et al. |
| 5,499,038 A | 3/1996 | DiSanto et al. |
| 5,508,068 A | 4/1996 | Nakano |
| 5,508,720 A | 4/1996 | DiSanto et al. |
| 5,512,162 A | 4/1996 | Sachs et al. |
| 5,528,399 A | 6/1996 | Izumi et al. |
| 5,543,177 A | 8/1996 | Morrison et al. |
| 5,543,219 A | 8/1996 | Elwakil |
| 5,545,291 A | 8/1996 | Smith et al. |
| 5,552,679 A | 9/1996 | Murasko |
| 5,556,583 A | 9/1996 | Tashiro |
| 5,561,443 A | 10/1996 | DiSanto et al. |
| 5,565,885 A | 10/1996 | Tamanoi |
| 5,569,610 A | 10/1996 | Zhang et al. |
| 5,573,711 A | 11/1996 | Hou et al. |
| 5,574,291 A | 11/1996 | Dodabalapur et al. |
| 5,575,554 A | 11/1996 | Guritz |
| 5,582,700 A | 12/1996 | Bryning et al. |
| 5,583,675 A | 12/1996 | Yamada et al. |
| 5,596,208 A | 1/1997 | Dodabalapur et al. |
| 5,597,889 A | 1/1997 | Takimoto et al. |
| 5,602,572 A | 2/1997 | Rylander |
| 5,604,027 A | 2/1997 | Sheridon |
| 5,604,070 A | 2/1997 | Rao et al. |
| 5,609,978 A | 3/1997 | Giorgianni et al. |
| 5,610,455 A | 3/1997 | Allen et al. |
| 5,614,340 A | 3/1997 | Bugner et al. |
| 5,619,307 A | 4/1997 | Machino et al. |
| 5,623,585 A | 4/1997 | Matias et al. |
| 5,625,199 A | 4/1997 | Baumbach et al. |
| 5,625,460 A | 4/1997 | Tai |
| 5,627,561 A | 5/1997 | Laspina et al. |
| 5,635,317 A | 6/1997 | Taniguchi et al. |
| 5,638,103 A | 6/1997 | Obata et al. |
| 5,639,914 A | 6/1997 | Tomiyama et al. |
| 5,643,506 A | 7/1997 | Rourke |
| 5,643,673 A | 7/1997 | Hou |
| 5,648,801 A | 7/1997 | Beardsley et al. |
| 5,649,266 A | 7/1997 | Rushing |
| 5,650,199 A | 7/1997 | Chang et al. |
| 5,650,247 A | 7/1997 | Taniguchi et al. |
| 5,650,872 A | 7/1997 | Saxe et al. |
| 5,654,367 A | 8/1997 | Takimoto et al. |
| 5,659,181 A | 8/1997 | Bridenbaugh et al. |
| 5,663,224 A | 9/1997 | Emmons et al. |
| 5,672,381 A | 9/1997 | Rajan |
| 5,673,148 A | 9/1997 | Morris et al. |
| 5,675,719 A | 10/1997 | Matias et al. |
| 5,676,884 A | 10/1997 | Tiers et al. |
| 5,684,501 A | 11/1997 | Knapp et al. |
| 5,686,383 A | 11/1997 | Long et al. |
| 5,688,584 A | 11/1997 | Casson et al. |
| 5,689,282 A | 11/1997 | Wolfs et al. |
| 5,691,098 A | 11/1997 | Busman et al. |
| 5,693,442 A | 12/1997 | Weiss et al. |
| 5,693,977 A | 12/1997 | Haddon et al. |
| 5,694,224 A | 12/1997 | Tai |
| 5,699,102 A | 12/1997 | Ng et al. |
| 5,705,826 A | 1/1998 | Aratani et al. |
| 5,707,738 A | 1/1998 | Hou |
| 5,707,747 A | 1/1998 | Tomiyama et al. |
| 5,708,525 A | 1/1998 | Sheridon |
| 5,709,976 A | 1/1998 | Malhotra |
| 5,714,051 A | 2/1998 | Van Leth et al. |
| 5,714,270 A | 2/1998 | Malhotra et al. |
| 5,715,511 A | 2/1998 | Aslam et al. |
| 5,715,514 A | 2/1998 | Williams et al. |
| 5,716,550 A | 2/1998 | Gardner et al. |
| 5,717,283 A | 2/1998 | Biegelsen et al. |
| 5,717,514 A | 2/1998 | Sheridon |
| 5,717,515 A | 2/1998 | Sheridon |
| 5,718,996 A | 2/1998 | Iijima et al. |
| 5,721,042 A | 2/1998 | Iijima et al. |
| 5,722,781 A | 3/1998 | Yamaguchi |
| 5,725,935 A | 3/1998 | Rajan |
| 5,729,632 A | 3/1998 | Tai |
| 5,729,663 A | 3/1998 | Lin et al. |
| 5,731,116 A | 3/1998 | Matsuo et al. |
| 5,737,115 A | 4/1998 | Mackinlay et al. |
| 5,738,716 A | 4/1998 | Santilli et al. |

| | | | | | | |
|---|---|---|---|---|---|---|
| 5,738,977 | A | 4/1998 | Van Der Sluis-Van Der Voort et al. | 6,137,467 | A | 10/2000 Sheridon et al. |
| 5,739,801 | A | 4/1998 | Sheridon | 6,144,361 | A * | 11/2000 Gordon, II et al. ......... 345/107 |
| 5,740,495 | A | 4/1998 | Maher et al. | 6,146,716 | A | 11/2000 Narang |
| 5,744,283 | A | 4/1998 | Spierings et al. | 6,153,075 | A | 11/2000 Nemelka |
| 5,745,094 | A | 4/1998 | Gordon, II et al. | 6,171,464 | B1 | 1/2001 Chadha |
| 5,750,238 | A | 5/1998 | Iijima et al. | 6,172,798 | B1 * | 1/2001 Albert et al. ................ 359/296 |
| 5,751,257 | A | 5/1998 | Sutherland | 6,177,921 | B1 | 1/2001 Comiskey et al. |
| 5,751,268 | A | 5/1998 | Sheridon | 6,184,856 | B1 | 2/2001 Gordon, II et al. |
| 5,751,433 | A | 5/1998 | Narendranath et al. | 6,215,920 | B1 | 4/2001 Whitehead et al. |
| 5,751,434 | A | 5/1998 | Narendranath et al. | 6,225,971 | B1 | 5/2001 Gordon, II et al. |
| 5,752,152 | A | 5/1998 | Gasper et al. | 6,232,950 | B1 | 5/2001 Albert et al. |
| 5,753,763 | A | 5/1998 | Rao et al. | 6,241,921 | B1 | 6/2001 Jacobson et al. |
| 5,754,332 | A | 5/1998 | Crowley | 6,252,564 | B1 | 6/2001 Albert et al. |
| 5,759,671 | A | 6/1998 | Tanaka et al. | 6,262,706 | B1 | 7/2001 Albert et al. |
| 5,760,761 | A | 6/1998 | Sheridon | 6,262,833 | B1 | 7/2001 Loxley et al. |
| 5,767,826 | A | 6/1998 | Sheridon et al. | 6,271,823 | B1 | 8/2001 Gordon, II et al. |
| 5,777,782 | A | 7/1998 | Sheridon | 6,300,932 | B1 | 10/2001 Albert |
| 5,783,614 | A | 7/1998 | Chen et al. | 6,376,828 | B1 | 4/2002 Comiskey |
| 5,783,856 | A | 7/1998 | Smith et al. | 2001/0045934 | A1 * | 11/2001 Turner et al. ................ 345/107 |
| 5,786,875 | A | 7/1998 | Brader et al. | 2002/0018042 | A1 * | 2/2002 Albert et al. ................ 345/107 |
| 5,808,783 | A | 9/1998 | Crowley | 2002/0053320 | A1 | 5/2002 Duthaler et al. |
| 5,821,137 | A | 10/1998 | Wakai et al. | 2002/0053900 | A1 | 5/2002 Jacobson et al. |
| 5,824,186 | A | 10/1998 | Smith et al. | 2002/0063677 | A1 | 5/2002 Drzak |
| 5,825,529 | A | 10/1998 | Crowley | 2002/0089735 | A1 * | 7/2002 Albert et al. ................ 359/296 |
| 5,828,432 | A | 10/1998 | Shashidhar et al. | | | |
| 5,843,259 | A | 12/1998 | Narang et al. | | | |
| 5,872,552 | A | 2/1999 | Gordon, II et al. | | | |
| 5,900,858 | A | 5/1999 | Richley | | | |
| 5,904,545 | A | 5/1999 | Smith et al. | | | |
| 5,914,805 | A * | 6/1999 | Crowley ..................... 359/296 | | | |
| 5,914,806 | A | 6/1999 | Gordon, II et al. | | | |
| 5,930,026 | A | 7/1999 | Jacobson et al. | | | |
| 5,936,259 | A | 8/1999 | Katz et al. | | | |
| 5,961,804 | A * | 10/1999 | Jacobson et al. ........... 204/606 | | | |
| 5,969,376 | A | 10/1999 | Bao | | | |
| 6,005,791 | A | 12/1999 | Gudesen et al. | | | |
| 6,005,817 | A | 12/1999 | Gudesen et al. | | | |
| 6,014,247 | A | 1/2000 | Winter et al. | | | |
| 6,017,584 | A | 1/2000 | Albert et al. | | | |
| 6,067,185 | A * | 5/2000 | Albert et al. ................ 204/478 | | | |
| 6,118,426 | A | 9/2000 | Albert et al. | | | |
| 6,120,588 | A | 9/2000 | Jacobson | | | |
| 6,120,839 | A | 9/2000 | Comiskey et al. | | | |
| 6,124,851 | A | 9/2000 | Jacobson | | | |
| 6,130,773 | A | 10/2000 | Jacobson et al. | | | |
| 6,130,774 | A * | 10/2000 | Albert et al. ................ 359/296 | | | |

OTHER PUBLICATIONS

U.S. Appl. No. 08/983,404, filed Jul. 19, 1996, Jacobson.
U.S. Appl. No. 09/140,846, filed Aug. 27, 1998, Albert et al.
U.S. Appl. No. 09/140,860, filed Aug. 27, 1998, Albert et al.
U.S. Appl. No. 09/140,862, filed Aug. 27, 1998, Albert et al.
U.S. Appl. No. 09/140,879, filed Aug. 27, 1998, Comiskey et al.
U.S. Appl. No. 09/141,126, filed Aug. 27, 1998, Comiskey et al.
U.S. Appl. No. 09/141,448, filed Aug. 27, 1998, Jacobson et al.
U.S. Appl. No. 09/143,469, filed Aug. 27, 1998, Jacobson et al.
U.S. Appl. No. 09/172,958, filed Oct. 14, 1998, Jacobson.
U.S. Appl. No. 09/289,507, filed Apr. 9, 1999, Wilcox et al.
U.S. Appl. No. 09/349,806, filed Jul. 8, 1999, Jacobson et al.
U.S. Appl. No. 09/359,937, filed Jul. 22, 1999, Albert.
U.S. Appl. No. 09/140,792, filed Aug. 27, 1998, Albert et al.
U.S. Appl. No. 09/141,041, filed Aug. 27, 1998, Comiskey et al.
U.S. Appl. No. 09/272,716, filed Mar. 18, 1999, Jacobson et al.
U.S. Appl. No. 09/310,300, filed May 12, 1999, Comiskey et al.
U.S. Appl. No. 09/432,343, filed Nov. 2, 1999, Albert et al.
U.S. Appl. No. 09/436,303, filed Nov. 8, 1999, Wilcox et al.
U.S. Appl. No. 09/467,324, filed Dec. 20, 1999, Comiskey et al.

* cited by examiner

ENCAPSULATED ELECTROPHORETIC DISPLAYS HAVING A MONOLAYER OF CAPSULES AND MATERIALS AND METHODS FOR MAKING THE SAME

CROSS-REFERENCE TO RELATED APPLICATIONS

The present application is a continuation of prior application Ser. No. 09/413,444 (the '444 application, now U.S. Pat. No. 6,839,158), filed on Oct. 6, 1999, in the U.S., the entire disclosure of which is incorporated by reference herein. The '444 application in turn claims priority to and the benefit of U.S. provisional patent application serial number 60/103,398, filed Oct. 7, 1998 and U.S. provisional patent application serial number 60/118,794, filed Feb. 4, 1999. The '444 application is also a continuation-in-part of U.S. Ser. No. 09/300,585 filed Apr. 27, 1999 and issued as U.S. Pat. No. 6,130,774, which in turn claims priority to U.S. Ser. No. 60/083,252 filed Apr. 27, 1998; and the '444 application is also a continuation-in-part of U.S. Ser. No. 09/141,105, filed Aug. 27, 1998 and issued as U.S. Pat. No. 6,067,185, which in turn claims priority to U.S. Ser. No. 60/057,133, filed Aug. 28, 1997, U.S. Ser. No. 60/057,716, filed Aug. 28, 1997, U.S. Ser. No. 60/057,799, filed Aug. 28, 1997, U.S. Ser. No. 60/057,163, filed Aug. 28, 1997, U.S. Ser. No. 60/057,122, filed Aug. 28, 1997, U.S. Ser. No. 60/057,798, filed Aug. 28, 1997, U.S. Ser. No. 60/057,118, filed Aug. 28, 1997, U.S. Ser. No. 60/059,358, filed Sep. 19, 1997, U.S. Ser. No. 60/065,630, filed Nov. 18, 1997, U.S. Ser. No. 60/065,605, filed Nov. 18, 1997, U.S. Ser. No. 60/066,147, filed Nov. 19, 1997, U.S. Ser. No. 60/066,245, filed Nov. 20, 1997, U.S. Ser. No. 60/066,246, filed Nov. 20, 1997, U.S. Ser. No. 60/066,115, filed Nov. 21, 1997, U.S. Ser. No. 60/066,334, filed Nov. 21, 1997, U.S. Ser. No. 60/066,418, filed Nov. 24, 1997, U.S. Ser. No. 60/071,371, filed Jan. 15, 1998, U.S. Ser. No. 60/070,940, filed Jan. 9, 1998, U.S. Ser. No. 60/072,390, filed Jan. 9, 1998, U.S. Ser. No. 60/070,939, filed Jan. 9, 1998, U.S. Ser. No. 60/070,935, filed Jan. 9, 1998, U.S. Ser. No. 60/074,454, filed Feb. 12, 1998, U.S. Ser. No. 60/076,955, filed Mar. 5, 1998, U.S. Ser. No. 60/076,959, filed Mar. 5, 1998, U.S. Ser. No. 60/076,957, filed Mar. 5, 1998, U.S. Ser. No. 60/076,978, filed Mar. 5, 1998, U.S. Ser. No. 60/078,363, filed Mar. 18, 1998, U.S. Ser. No. 60/083,252, filed Apr. 27, 1998, U.S. Ser. No. 60/085,096, filed May 12, 1998, and U.S. Ser. No. 60/093,689, filed Jul. 22, 1998.

GOVERNMENT RIGHTS

This invention was made with Government support under Agreement No. DAAN02-98-3-0004, awarded by SSCOM. The Government has certain rights in the invention.

TECHNICAL FIELD

The present invention generally relates to materials and methods for forming a monolayer of capsules for an encapsulated electrophoretic display.

BACKGROUND INFORMATION

Current electrophoretic display technology produces a display that neither is as bright nor has as much contrast as is desired. Current displays are not capable of achieving uniform brightness or good contrast due to limitations in their construction. Thus, new materials and methods of construction are needed to provide electrophoretic displays with acceptable brightness and contrast.

SUMMARY OF THE INVENTION

The present invention is directed to a bright, high-contrast encapsulated electrophoretic display. Such a display can be achieved with various materials and methods that allow the display to be constructed such that a monolayer of capsules on a substrate is formed. The capsules contain at least an electrophoretically mobile particle and a suspending fluid. In addition to forming a monolayer, materials and methods of the present invention allow the capsules in the monolayer to pack together and/or deform in certain, useful configurations. For example, capsules can be non-spherical.

Throughout the Specification, the invention is described as a display for ease of description. However, the compositions and processes disclosed herein are equally applicable to "elements." A display is one example of the broader concept of an element. One or more elements can be ordered into a display or other articles of manufacture. Elements can include any of the features described for a display.

Generally, particles move within the capsule under the influence of a voltage. Depending upon the location of the particles and the composition of the suspending fluid, various visual states are available. In one highly generalized example, reflecting particles, located at the front of the capsule (towards a viewer) in a colored dye, will reflect light and appear "white." When the reflecting particles move towards the rear of the capsule (opposite the viewer) upon application of an electric, the particles will be obscured by the dyed fluid and will appear "dark" to a viewer.

The successful construction of an encapsulated electrophoretic display requires the proper interaction of several different types of materials and processes. Materials such as a polymeric binder, a capsule membrane, and electrophoretic particles and fluid must all be chemically compatible. The capsule membranes may engage in useful surface interactions with the electrophoretic particles, or may act as an inert physical boundary between the fluid and the binder. Polymer binders may set as adhesives between capsule membranes and electrode surfaces.

In some cases, a separate encapsulation step of the process is not necessary. The electrophoretic fluid may be directly dispersed or emulsified into the binder (or a precursor to the binder material) to form what may be called a "polymer-dispersed electrophoretic display." In such displays, the individual electrophoretic phases may be referred to as capsules or microcapsules even though no capsule membrane is present. Such polymer-dispersed electrophoretic displays are considered to be subsets of encapsulated electrophoretic displays.

In an encapsulated electrophoretic display, the binder material surrounds the capsules and separates the two electrodes. This binder material should be compatible with the capsule and electrodes and should possess properties that allow for facile printing or coating. It may also possess barrier properties for water, oxygen, ultraviolet light, the electrophoretic fluid, or other materials. Further, it may contain surfactants and cross-linking agents, which could aid in coating or durability. The polymer-dispersed electrophoretic display may be of the emulsion or phase separation type.

In one aspect of the invention, an encapsulated electrophoretic element has a plurality of non-spherical capsules disposed substantially in a single layer on a substrate.

In another aspect of the invention, an encapsulated electrophoretic element has a plurality of capsules disposed substantially in a single layer on a substrate and in association with a binder, thereby to form a film. The binder can include a binder solid, and a ratio of a mass of the binder solid to a mass of the capsules of at least a portion of the element can be from about 1:2 to about 1:20.

In another aspect of the invention, an encapsulated electrophoretic element has a plurality of capsules disposed substantially in a single layer on a substrate and associated with a binder, thereby to form a film. At least a portion of the element has an optically active fraction of at least 70%.

The various aspects of the present invention can have any of the following features. Additionally, elements of these aspects or those described below, along with any of the features described below, can be used alone or in combination to form a display. A plurality of capsules can be disposed on the substrate and can be in association with a binder, thereby to form a film. The film can have a binder that includes a binder solid and a ratio of a mass of the binder solid to a mass of the capsules, of at least a portion of the element, can be from about 1:2 to about 1:20. At least a portion of the element can have an optically active fraction of at least 70%. The capsules can be non-spherical and/or substantially planar on at least one side proximate the substrate. The film can include closely-packed capsules. At least one of the capsules can include a suspending fluid and at least one species of particle, or at least one of the capsules can include at least two species of particles such that an optical property of at least two of the particle species is different. The capsules can be a polymer matrix having fluid-containing (such as oil) cavities. A capsule wall defines the capsule and can have a thickness from about 0.2 µm to about 10 µm. The substrate can include a polymeric material, a polyester film, and/or at least one electrode (such as indium tin oxide). The substrate can be from about 25 µm to about 500 µm thick.

An element also can have a layer of material that substantially fills interstices formed within the film that also can be substantially planar or a side opposite the film. A rear substrate can be disposed adjacent the layer of material. The layer of material can be initially associated with the film or with the rear substrate. The capsules, binder, and layer of material can form a stratum having a substantially uniform thickness and/or a stratum that is substantially free from voids. The stratum can be from about 10 µm to about 500 µm thick, preferably about 50 µm to about 300 µm thick. The capsules can be of substantially uniform size. The layer of material can be the binder. The layer of material can include an insulator, conductor, or semiconductor. The layer of material can be tacky or liquid prior to, during, and/or after substantially filling the interstices within the film. The layer of material can have a thickness of less than or equal to about 50 µm. The layer of material can include an adhesive containing, for example, carbon particles, gold particles, aluminum particles, platinum particles, silver particles, plated polymer spheres, plated glass spheres, indium tin oxide particles, polyacetylene, polyaniline, polypyrrole, polyethylene dioxythiophene ("P-DOT"), and/or polythiophene.

The rear substrate can include at least one electrode, at least one transistor, and/or at least one diode. The transistor can be at least organic material or silicon-based. The rear substrate can include a polymeric material, a glass, or a metal.

In another aspect of the invention, an encapsulated electrophoretic element includes a plurality of non-spherical capsules disposed substantially in a single layer on a substrate, thereby to form a film. Typically, the element of this embodiment contains substantially no binder. This aspect can have any of the features described above. Additionally, this aspect can have any of the following features. The capsules and layer of material can form a stratum that has a substantially uniform thickness and/or that is substantially free from voids. Additionally, one or more of the elements of this aspect of the invention can be combined with other elements of this aspect or the other aspects of the present invention to form a display.

In another aspect of the invention, a process for creating an encapsulated electrophoretic element that is capable of having a plurality of capsules disposed on a substrate in substantially a single layer includes the steps of (a) providing the capsules; (b) mixing at least one of the capsules with a binder to create a capsule/binder mixture; (c) coating the capsule/binder mixture onto an at least partially conductive substrate, thereby to create a film; and (d) curing the capsule/binder mixture.

This aspect of the invention can have any of the features listed above or any of the following features. The binder can be selected from the group consisting of acrylic, urethane, and poly(vinyl alcohol). The binder can include a polymer latex. The binder can have a fraction that is capable of evaporating. The conductive substrate can include an indium tin oxide sputtered polyester film. At least one of the capsules can contain a plurality of particles (such as titanium dioxide particles) dispersed in a suspending fluid. The suspending fluid can include a halogenated hydrocarbon and/or an aliphatic hydrocarbon.

The coating step can include applying pressurized gas to the capsule/binder mixture, thereby to cause deposition of the capsule/binder mixture onto the substrate such that the capsules are disposed on the substrate in substantially a single layer. The coating step can further include heating, cooling, and/or adding a liquid to the pressurized gas prior to or during application of the pressurized gas to the capsule/binder mixture. The liquid can be in droplet form and/or can be an organic solvent. The organic solvent can include, for example, butyl acetate, methylene chloride, and/or chlorobenzene. The organic solvent can include an alcohol, for example, isopropyl alcohol, methanol, and/or ethanol. The coating step can include applying the pressurized gas with an air knife at a distance of about 1 cm to about 15 cm from the surface of the capsule/binder mixture and/or at an angle of from about 0 degrees to about 90 degrees from the surface of the conductive substrate. The pressurized gas can include air.

The coating step can include coating at least some of the capsules onto a film through a coating head, for example with a pump that, typically, provides pumping pressure with a low shear force. At least some of the capsules can be disposed in and form a single layer. The coating head can be a slot die coating head. Typically, a width of a slot of the slot die coating head is between about 1 and about 2.5 times the mean diameter of the capsules The process can further include laminating the film to a rear substrate. A layer of material can be disposed between the film and the rear substrate. The layer of material can be associated with the rear substrate and/or with the film prior to laminating. Heating, pressurizing, and/or evacuating of a gas can occur during the step of laminating. The layer of material can be insulating, conductive, or semiconductive. The layer of material can be tacky or in a liquid state during at least a portion of the laminating step. The layer of material can include the binder. The step of laminating can produce a stratum comprising the capsules, binder, and layer of material. The stratum can have at least one substantially planar side proximate the rear substrate, can be substantially free from voids, and/or have a substantially uniform thickness. The layer of material can substantially fill interstices within the film. The layer of material can have a thickness of less than or equal to about 50 μm. The layer of material can include an adhesive containing, for example, carbon particles, gold particles, aluminum particles, platinum particles, silver particles, plated polymer spheres, plated glass spheres, indium tin oxide particles, polyacetylene, polyaniline, polypyrrole, P-DOT, and/or polythiophene. The binder can include a binder solid and a ratio of the mass of the binder solid to the mass of the capsules of at least a portion of the element can be from about 1:2 to about 1:20.

The process can further include the step of removing water from association with at least some of the capsules. The step of removing water can include a process selected from the group consisting of centrifuging, absorbing, evaporating, mesh filtrating and osmotic separating.

BRIEF DESCRIPTION OF THE DRAWINGS

The invention, in accordance with preferred and exemplary embodiments, together with further advantages thereof, is more particularly described in the following detailed description, taken in conjunction with the accompanying drawings.

In the drawings, like reference characters generally refer to the same parts throughout the different views. Also, the drawings are not necessarily to scale, emphasis instead generally being placed upon illustrating principles of the invention.

DESCRIPTION

The present invention provides materials and methods that improve performance of encapsulated electrophoretic display devices. In the construction of encapsulated electrophoretic display devices, a closely packed structure of capsules (which typically contain electrophoretic particles) in a single layer is desirable. For example, capsules in a closely packed structure include those in a high-density, closely-spaced configuration. Additionally, deformable capsules that allow the walls of the capsules to fit together closely, with little binding material between them, are desirable. For example, these capsules may take on a non-spherical shape.

Generally, an encapsulated electrophoretic display includes one or more species of particle that either absorb or scatter light. One example is a system in which the capsules contain one or more species of electrophoretically mobile particles dispersed in a dyed suspending fluid. Another example is a system in which the capsules contain two separate species of particles suspended in a clear suspending fluid, in which one species of particle absorbs light (dark), while the other species of particle scatters light (white). There are other extensions (more than two species of particles, with or without a dye, etc.). The particles are commonly solid pigments, dyed particles, or pigment/polymer composites.

In a closely packed state, typically, a single layer of capsules is desirable as the optically active portion of the device. The capsules typically contain an opaque pigment, and transmit little or no light in any state of the device. Thus, light impinging on the first layer of close-packed capsules is either scattered or absorbed. Little light passes through the capsules. If individual capsules (or a second layer of capsules) are positioned underneath the first layer of capsules, little or no light reaches these capsules. As such, the second layer does not contribute significantly to the optical effect. Additionally, because additional layers of capsules add thickness to the film, the voltage required to operate the film is raised without providing any optical benefit.

Figure 1A:
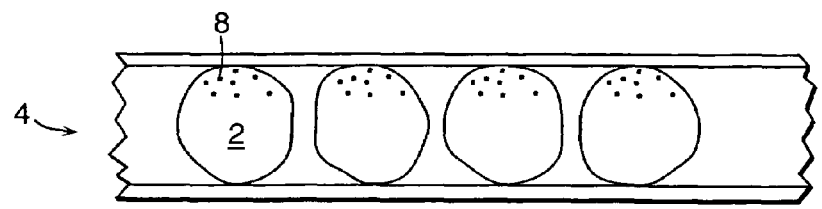
FIG. 1A is a schematic representation of a cross-section of a monolayer of capsules.
Figure 1B:
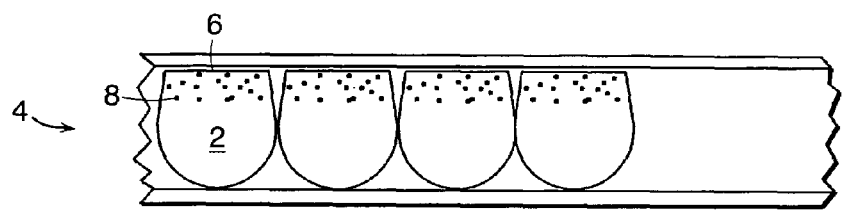
FIG. 1B is a schematic representation of a cross-section of a monolayer of deformable, non-spherical capsules.

Thus, construction of the encapsulated electrophoretic display device with capsules in a closely-packed monolayer is desirable. Referring to FIGS. 1A and 1B, typically, capsules 2 are substantially uniform in size. Also, the capsules 2 can be deformable such that a monolayer 4 can form a flat (or nearly flat) surface 6 as shown in FIG. 1B. In one instance, the flat surface 6 allows the capsules 2 to pack together more closely, thus allowing the particles 8 within the capsules 2 to more uniformly spread across the face of the display (compare the distribution of particles 8 in FIG. 1A with the distribution in FIG. 1B). Additionally, a flat surface on the other side of the capsules (not shown) allows for laminating a second substrate (or second conductive substrate) that makes good contact with the capsule layer. This flat top surface can form spontaneously, or can be formed by coating or laminating another material to the capsules. Typically, capsules have a wall thickness of about 0.2 µm to about 10 µm, more preferably about 1 µm to about 5 µm.

In fact, one way to measure the state of the display involves a variable called the "optically active fraction." This variable refers to an area of a display that is capable of having its appearance changed as compared with the total area of a display. The variable can be expressed as a ratio, namely, (changeable surface area of display)/(total surface area of display). When calculating total area, one can easily calculate a surface area of the display using common geometric formulae. However, due to the nature of capsules, a viewer sees optically active areas of capsules (i.e, visible portions of the capsule that change appearance) that are not in the plane of the display, the plane upon which a total surface area usually is calculated. Thus, the location of optically active areas must be extrapolated to the plane upon which total surface area is calculated in order to estimate the optically active fraction.

Figure 6A:
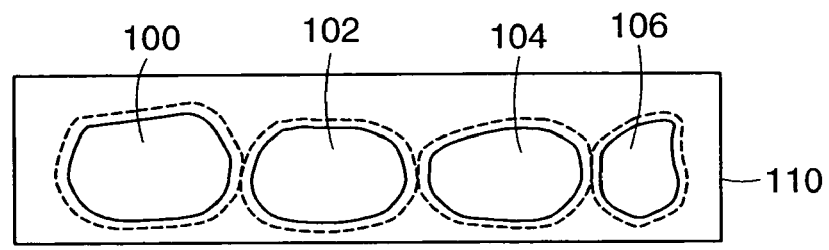
FIG. 6A is a schematic top view of a display illustrating calculation of optically active fraction.
Figure 6B:
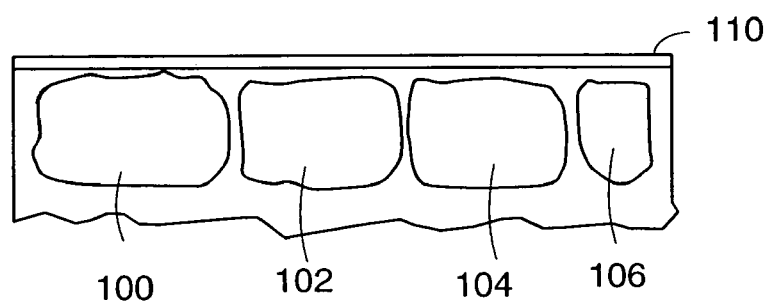
FIG. 6B is a schematic side view of a display illustrating calculation of optically active fraction.

FIGS. 6A and 6B illustrate extrapolation of the optically active areas for estimating the optically active fraction. FIG. 6A is a top view and FIG. 6B is a side view of the same structure, both views are aligned. Four capsules 100, 102, 104, 106 are shown in a schematic plane 110 of a display. This rectangular plane 110 represents the total surface area of the display. Due to the shape of the capsules 100, 102, 104, 106, the optically active area of the capsules 100, 102, 104, 106 that is roughly coincident with the plane 110 (shown with solid lines in FIG. 6A) is slightly smaller than the total optically active area (shown with dashed lines in FIG. 6A). Thus, according to the extrapolation technique, the total optically active area, as represented by the dashed lines, is superimposed on the plane 110. FIG. 6B shows how a portion of the capsules 100, 102, 104, 106 is close to, but not coincident with, the plane 110 of the display, explaining why the solid lines and dashed lines in FIG. 6A are not coincident. In practice, useful optically active fractions are equal to or greater than about 70% and more preferably equal to or greater than about 90%.

Non-spherical microcapsules can be formed during the encapsulation phase, by, for example, using a non-uniform shear field or a compressive pressure. Such non-spherical capsules can also be formed during the processing of the display when the binder is drying or curing. In such a system, as the binder shrinks, it pulls capsules close to one another and pulls the capsules down toward the substrate on which they have been coated. For example, an aqueous evaporative binder, such as a waterbourne acrylic, urethane, or poly(vinylalcohol), tends to exhibit such shrinking properties. Typically, a fraction of the binder, such as water, evaporates. Other evaporative binders, emulsions, or solutions also are suitable. The solvent need not be water, but can be an organic liquid or a combination of liquids.

Also, non-spherical capsules can be formed, for example, by applying a force to the film as it is drying or curing to permanently deform the capsules. Such a force can be applied by a pair of rollers, by a vacuum lamination press, by a mechanical press, or by any other suitable means. Such non-spherical capsules can also be formed by stretching the cured film in one or both of the planar axes of the film. After completion of the curing process, the capsule can protrude above the surface of the cured film, resulting in a lens effect that enhances the optical properties of the capsule. Finally, the capsule also can be formed of a material which softens in the binder, thus allowing the capsules to deform to form a flat surface when the capsules and binder are laid down and the binder is cured.

Figure 10:
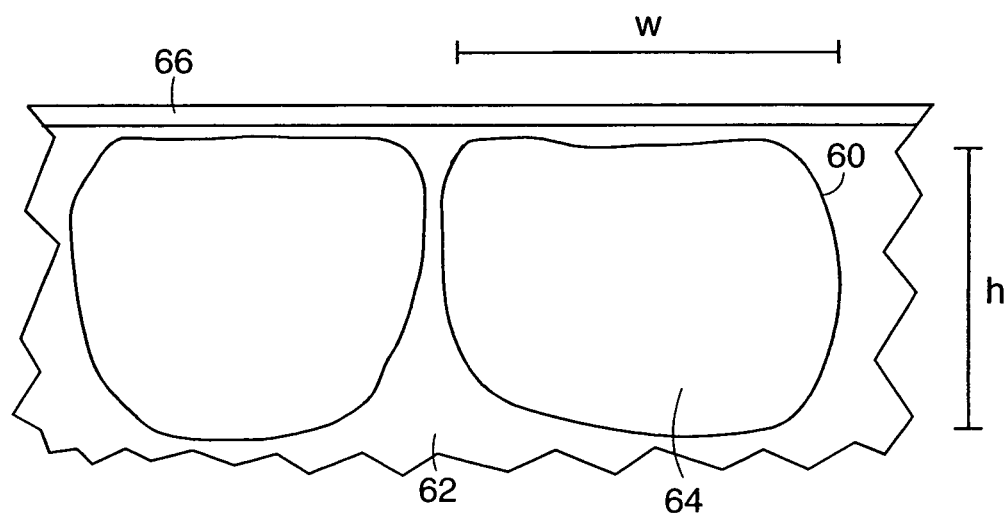
FIG. 10 is a schematic illustration of capsules that are fluid-filled cavities in a matrix.

In another embodiment, a polymer-dispersed electrophoretic display is constructed in a manner similar to a polymer-dispersed liquid crystal display. A fluid is mixed with a binder. Typically, the fluid can be an oil. As the binder is dried or is cured, the fluid is pulled into non-spherical cavities. These fluid-containing cavities can be elastomeric capsules. These cavities typically lack capsule walls. For example, FIG. 10 shows a cavity 60 filled with an oil 64. The cavity is situated in a matrix 62. The matrix 62 is adjacent a substrate 66. Typically, the matrix 62 is formed from a polymer which can be a binder. In a preferred embodiment, the aspect ratio (i.e., ratio of width, w, to height, h) of these cavities is preferably greater than about 1.2. The aspect ratio is more preferably greater than about 1.5, and, in a particularly preferred embodiment, the aspect ratio is greater than about 1.75. In a preferred embodiment, a display having non-spherical capsules has a volume fraction (i.e., fraction of total volume) of binder between about 0 to about 0.9. More preferably, the volume fraction is between about 0.05 and about 0.2.

An electrophoretic display is constructed as either an encapsulated electrophoretic display or a polymer-dispersed electrophoretic display (similar in construction to a polymer dispersed liquid crystal display), and the non-spherical capsules or liquid droplets are formed by flattening, by shrinkage of the binder, or by mechanical force. In each case, the capsules should be capable of deforming, or they may rupture. In the case of a polymer-dispersed electrophoretic display, the encapsulated phases change shape as the polymer shrinks. In addition, the encapsulated phases may be deformed asymmetrically by stretching the substrate. Another technique which may be employed is to first dry the binder in such a way that a tough top skin is formed. The rest of the binder may then be dried slowly with no fear of the top surface breaking or becoming too uneven.

Taking a step back from the specifics of monolayers and methods of forming monolayers according to the invention, Section I generally describes some of the components of electrophoretic displays according to the invention. More detail is provided in U.S. application Ser. No. 09/141,105 filed Aug. 27, 1998, the entirety of which is incorporated herein by reference. Section II describes components of displays and processes for constructing displays in a monolayer.

I. Electrophoretic Display Components

A. Particles

There is much flexibility in the choice of particles for use in electrophoretic displays, as described above. For purposes of this invention, a particle is any component that is charged or capable of acquiring a charge (i.e., has or is capable of acquiring electrophoretic mobility), and, in some cases, this mobility may be zero or close to zero (i.e., the particles will not move). The particles may be neat pigments, dyed (laked) pigments or pigment/polymer composites, or any other component that is charged or capable of acquiring a charge. Typical considerations for the electrophoretic particle are its optical properties, electrical properties, and surface chemistry. The particles may be organic or inorganic compounds, and they may either absorb light or scatter light. The particles for use in the invention may further include scattering pigments, absorbing pigments and luminescent particles. The particles may be retroreflective, such as corner cubes, or they may be electroluminescent, such as zinc sulfide particles, which emit light when excited by an AC field, or they may be photoluminescent. Finally, the particles may be surface treated so as to improve charging or interaction with a charging agent, or to improve dispersibility.

One particle for use in electrophoretic displays of the invention is titania. The titania particles may be coated with a metal oxide, such as aluminum oxide or silicon oxide, for example. The titania particles may have one, two, or more layers of metal-oxide coating. For example, a titania particle for use in electrophoretic displays of the invention may have a coating of aluminum oxide and a coating of silicon oxide. The coatings may be added to the particle in any order.

The electrophoretic particle is usually a pigment, a polymer, a laked pigment, or some combination of the above. A neat pigment can be any pigment, and, usually for a light colored particle, pigments such as rutile (titania), anatase (titania), barium sulfate, kaolin, or zinc oxide are useful. Some typical particles have high refractive indices, high scattering coefficients, and low absorption coefficients. Other particles are absorptive, such as carbon black or colored pigments used in paints and inks. The pigment should also be insoluble in the suspending fluid. Yellow pigments such as diarylide yellow, hansa yellow, and benzidin yellow have also found use in similar displays. Any other reflective material can be employed for a light colored particle, including non-pigment materials, such as metallic particles.

Useful neat pigments include, but are not limited to, $PbCrO_4$, Cyan blue GT 55-3295 (American Cyanamid Company, Wayne, N.J.), Cibacron Black BG (Ciba Company, Inc., Newport, Del.), Cibacron Turquoise Blue G (Ciba), Cibalon Black BGL (Ciba), Orasol Black BRG (Ciba), Orasol Black RBL (Ciba), Acetamine Blac, CBS (E. I. du Pont de Nemours and Company, Inc., Wilmington, Del.), Crocein Scarlet N Ex (du Pont) (27290), Fiber Black VF (duPont) (30235), Luxol Fast Black L (duPont) (Solv. Black 17), Nirosine Base No. 424 (duPont) (50415 B), Oil Black BG (duPont) (Solv. Black 16), Rotalin Black RM (duPont), Sevron Brilliant Red 3 B (duPont); Basic Black DSC (Dye Specialties, Inc.), Hectolene Black (Dye Specialties, Inc.), Azosol Brilliant Blue B (GAF, Dyestuff and Chemical Division, Wayne, N.J.) (Solv. Blue 9), Azosol Brilliant Green BA (GAF) (Solv. Green 2), Azosol Fast Brilliant Red B (GAF), Azosol Fast Orange RA Conc. (GAF) (Solv. Orange 20), Azosol Fast Yellow GRA Conc. (GAF) (13900 A), Basic Black KMPA (GAF), Benzofix Black CW-CF (GAF) (35435), Cellitazol BNFV Ex Soluble CF (GAF) (Disp. Black 9), Celliton Fast Blue AF Ex Conc (GAF) (Disp. Blue 9), Cyper Black IA (GAF) (Basic Blk. 3), Diamine Black CAP Ex Conc (GAF) (30235), Diamond Black EAN Hi Con. CF (GAF) (15710), Diamond Black PBBA Ex (GAF) (16505); Direct Deep Black EA Ex CF (GAF) (30235), Hansa Yellow G (GAF) (11680); Indanthrene Black BBK Powd. (GAF) (59850), Indocarbon CLGS Conc. CF (GAF) (53295), Katigen Deep Black NND Hi Conc. CF (GAF) (15711), Rapidogen Black 3 G (GAF) (Azoic Blk. 4); Sulphone Cyanine Black BA-CF (GAF) (26370), Zambezi Black VD Ex Conc. (GAF) (30015); Rubanox Red CP-1495 (The Sherwin-Williams Company, Cleveland, Ohio) (15630); Raven 11 (Columbian Carbon Company, Atlanta, Ga.), (carbon black aggregates with a particle size of about 25 µm), Statex B-12 (Columbian Carbon Co.) (a furnace black of 33 µm average particle size), and chrome green.

Particles may also include laked, or dyed, pigments. Laked pigments are particles that have a dye precipitated on them or which are stained. Lakes are metal salts of readily soluble anionic dyes. These are dyes of azo, triphenylmethane or anthraquinone structure containing one or more sulphonic or carboxylic acid groupings. They are usually precipitated by a calcium, barium or aluminum salt onto a substrate. Typical examples are peacock blue lake (CI Pigment Blue 24) and Persian orange (lake of CI Acid Orange 7), Black M Toner (GAF) (a mixture of carbon black and black dye precipitated on a lake).

A dark particle of the dyed type may be constructed from any light absorbing material, such as carbon black, or inorganic black materials. The dark material may also be selectively absorbing. For example, a dark green pigment may be used. Black particles may also be formed by staining latices with metal oxides, such latex copolymers consisting of any of butadiene, styrene, isoprene, methacrylic acid, methyl methacrylate, acrylonitrile, vinyl chloride, acrylic acid, sodium styrene sulfonate, vinyl acetate, chlorostyrene, dimethylaminopropylmethacrylamide, isocyanoethyl methacrylate and N-(isobutoxymethacrylamide), and optionally including conjugated diene compounds such as diacrylate, triacrylate, dimethylacrylate and trimethacrylate. Black particles may also be formed by a dispersion polymerization technique.

In the systems containing pigments and polymers, the pigments and polymers may form multiple domains within the electrophoretic particle, or be aggregates of smaller pigment/polymer combined particles. Alternatively, a central pigment core may be surrounded by a polymer shell. The pigment, polymer, or both can contain a dye. The optical purpose of the particle may be to scatter light, absorb light, or both. Useful sizes may range from 1 nm up to about 100 µm, as long as the particles are smaller than the bounding capsule. The density of the electrophoretic particle may be substantially matched to that of the suspending (i.e., electrophoretic) fluid. As defined herein, a suspending fluid has a density that is "substantially matched" to the density of the particle if the difference in their respective densities is between about zero and about two grams/milliliter ("g/ml"). This difference is preferably between about zero and about 0.5 g/ml.

Useful polymers for the particles include, but are not limited to: polystyrene, polyethylene, polypropylene, phenolic resins, Du Pont Elvax resins (ethylene-vinyl acetate copolymers), polyesters, polyacrylates, polymethacrylates, ethylene acrylic acid or methacrylic acid copolymers (Nucrel Resins—Dupont, Primacor Resins—Dow Chemical), acrylic copolymers and terpolymers (Elvacite Resins, DuPont) and PMMA. Useful materials for homopolymer/pigment phase separation in high shear melt include, but are not limited to, polyethylene, polypropylene, polymethylmethacrylate, polyisobutylmethacrylate, polystyrene, polybutadiene, polyisoprene, polyisobutylene, polylauryl methacrylate, polystearyl methacrylate, polyisobornyl methacrylate, poly-t-butyl methacrylate, polyethyl methacrylate, polymethyl acrylate, polyethyl acrylate, polyacrylonitrile, and copolymers of two or more of these materials. Some useful pigment/polymer complexes that are commercially available include, but are not limited to, Process Magenta PM 1776 (Magruder Color Company, Inc., Elizabeth, N.J.), Methyl Violet PMA VM6223 (Magruder Color Company, Inc., Elizabeth, N.J.), and Naphthol FGR RF6257 (Magruder Color Company, Inc., Elizabeth, N.J.).

The pigment-polymer composite may be formed by a physical process, (e.g., attrition or ball milling), a chemical process (e.g., microencapsulation or dispersion polymerization), or any other process known in the art of particle production. For example, the processes and materials for both the fabrication of liquid toner particles and the charging of those particles may be relevant.

New and useful electrophoretic particles may still be discovered, but a number of particles already known to those skilled in the art of electrophoretic displays and liquid toners can also prove useful. In general, the polymer requirements for liquid toners and encapsulated electrophoretic inks are similar, in that the pigment or dye must be easily incorporated therein, either by a physical, chemical, or physicochemical process, may aid in the colloidal stability, and may contain charging sites or may be able to incorporate materials which contain charging sites. One general requirement from the liquid toner industry that is not shared by encapsulated electrophoretic inks is that the toner must be capable of "fixing" the image, i.e., heat fusing together to create a uniform film after the deposition of the toner particles.

Typical manufacturing techniques for particles may be drawn from the liquid toner and other arts and include ball milling, attrition, jet milling, etc. The process will be illustrated for the case of a pigmented polymeric particle. In such a case the pigment is compounded in the polymer, usually in some kind of high shear mechanism such as a screw extruder. The composite material is then (wet or dry) ground to a starting size of around 10 µm. It is then dispersed in a carrier liquid, for example ISOPAR® (Exxon, Houston, Tex.), optionally with some charge control agent(s), and milled under high shear for several hours down to a final particle size and/or size distribution.

Another manufacturing technique for particles is to add the polymer, pigment, and suspending fluid to a media mill. The mill is started and simultaneously heated to temperature at which the polymer swells substantially with the solvent. This temperature is typically near 100° C. In this state, the pigment is easily encapsulated into the swollen polymer. After a suitable time, typically a few hours, the mill is gradually cooled back to ambient temperature while stirring. The milling may be continued for some time to achieve a small enough particle size, typically a few microns in diameter. The charging agents may be added at this time. Optionally, more suspending fluid may be added.

Chemical processes such as dispersion polymerization, mini- or micro-emulsion polymerization, suspension polymerization precipitation, phase separation, solvent evaporation, in situ polymerization, seeded emulsion polymerization, or any process which falls under the general category of microencapsulation may be used. A typical process of this type is a phase separation process wherein a dissolved polymeric material is precipitated out of solution onto a dispersed pigment surface through solvent dilution, evaporation, or a thermal change. Other processes include chemical means for staining polymeric latices, for example with metal oxides or dyes.

B. Suspending Fluid

The suspending fluid containing the particles can be chosen based on properties such as density, refractive index, and solubility. A preferred suspending fluid has a low dielectric constant (about 2), high volume resistivity (about $10^{15}$ ohm-cm), low viscosity (less than 5 centistokes ("cst")), low toxicity and environmental impact, low water solubility (less than 10 parts per million ("ppm")), high specific gravity (greater than 1.5), a high boiling point (greater than 90° C.), and a low refractive index (less than 1.2).

The choice of suspending fluid may be based on concerns of chemical inertness, density matching to the electrophoretic particle, or chemical compatibility with both the electrophoretic particle and bounding capsule. The viscosity of the fluid should be low when movement of the particles is desired. The refractive index of the suspending fluid may also be substantially matched to that of the particles. As used herein, the refractive index of a suspending fluid "is substantially matched" to that of a particle if the difference between their respective refractive indices is between about zero and about 0.3, and is preferably between about 0.05 and about 0.2.

Additionally, the fluid may be chosen to be a poor solvent for some polymers, which is advantageous for use in the fabrication of microparticles, because it increases the range of polymeric materials useful in fabricating particles of polymers and pigments. Organic solvents, such as halogenated organic solvents, saturated linear or branched hydrocarbons, silicone oils, and low molecular weight halogen-containing polymers are some useful suspending fluids. The suspending fluid may comprise a single fluid. The fluid will, however, often be a blend of more than one fluid in order to tune its chemical and physical properties. Furthermore, the fluid may contain surface modifiers to modify the surface energy or charge of the electrophoretic particle or bounding capsule. Reactants or solvents for the microencapsulation process (oil soluble monomers, for example) can also be contained in the suspending fluid. Charge control agents can also be added to the suspending fluid.

Useful organic solvents include, but are not limited to, epoxides, such as decane epoxide and dodecane epoxide; vinyl ethers, such as cyclohexyl vinyl ether and Decave® (International Flavors & Fragrances, Inc., New York, N.Y.); and aromatic hydrocarbons, such as toluene and naphthalene. Useful halogenated organic solvents include, but are not limited to, tetrafluorodibromoethylene, tetrachloroethylene, trifluorochloroethylene, 1,2,4-trichlorobenzene, carbon tetrachloride. These materials have high densities. Useful hydrocarbons include, but are not limited to, dodecane, tetradecane, the aliphatic hydrocarbons in the Isopar® series (Exxon, Houston, Tex.), Norpar® (series of normal paraffinic liquids), Shell-Sol® (Shell, Houston, Tex.), and Sol-Trol® (Shell), naphtha, and other petroleum solvents. These materials usually have low densities. Useful examples of silicone oils include, but are not limited to, octamethyl cyclosiloxane and higher molecular weight cyclic siloxanes, poly (methyl phenyl siloxane), hexamethyldisiloxane, and polydimethylsiloxane. These materials usually have low densities. Useful low molecular weight halogen-containing polymers include, but are not limited to, poly(chlorotrifluoroethylene) polymer (Halogenated hydrocarbon Inc., River Edge, N.J.), Galden® (a perfluorinated ether from Ausimont, Morristown, N.J.), or Krytox® from Dupont (Wilmington, Del.). In a preferred embodiment, the suspending fluid is a poly(chlorotrifluoroethylene) polymer. In a particularly preferred embodiment, this polymer has a degree of polymerization from about 2 to about 10. Many of the above materials are available in a range of viscosities, densities, and boiling points.

The fluid must be capable of being formed into small droplets prior to a capsule being formed. Processes for forming small droplets include flow-through jets, membranes, nozzles, or orifices, as well as shear-based emulsifying schemes. The formation of small drops may be assisted by electrical or sonic fields. Surfactants and polymers can be used to aid in the stabilization and emulsification of the droplets in the case of an emulsion type encapsulation. One surfactant for use in displays of the invention is sodium dodecylsulfate.

It can be advantageous in some displays for the suspending fluid to contain an optically absorbing dye. This dye must be soluble in the fluid, but will generally be insoluble in the other components of the capsule. There is much flexibility in the choice of dye material. The dye can be a pure compound, or blends of dyes to achieve a particular color, including black. The dyes can be fluorescent, which would produce a display in which the fluorescence properties depend on the position of the particles. The dyes can be photoactive, changing to another color or becoming colorless upon irradiation with either visible or ultraviolet light, providing another means for obtaining an optical response. Dyes could also be polymerizable, forming a solid absorbing polymer inside the bounding shell.

There are many dyes that can be chosen for use in encapsulated electrophoretic display. Properties important here include light fastness, solubility in the suspending liquid, color, and cost. These are generally from the class of azo, anthraquinone, and triphenylmethane type dyes and may be chemically modified so as to increase the solubility in the oil phase and reduce the adsorption by the particle surface.

A number of dyes already known to those skilled in the art of electrophoretic displays will prove useful. Useful azo dyes include, but are not limited to: the Oil Red dyes, and the Sudan Red and Sudan Black series of dyes. Useful anthraquinone dyes include, but are not limited to: the Oil Blue dyes, and the Macrolex Blue series of dyes. Useful triphenylmethane dyes include, but are not limited to, Michler's hydrol, Malachite Green, Crystal Violet, and Auramine O.

C. Charge Control Agents and Particle Stabilizers

Charge control agents are used to provide good electrophoretic mobility to the electrophoretic particles. Stabilizers are used to prevent agglomeration of the electrophoretic particles, as well as prevent the electrophoretic particles from irreversibly depositing onto the capsule wall. Either component can be constructed from materials across a wide range of molecular weights (low molecular weight, oligomeric, or polymeric), and may be pure or a mixture. The charge control agent used to modify and/or stabilize the particle surface charge is applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

An optional charge control agent or charge director may be used. These constituents typically consist of low molecular weight surfactants, polymeric agents, or blends of one or more components and serve to stabilize or otherwise modify the sign and/or magnitude of the charge on the electrophoretic particles. The charging properties of the pigment itself may be accounted for by taking into account the acidic or basic surface properties of the pigment, or the charging sites may take place on the carrier resin surface (if present), or a combination of the two. Additional pigment properties which may be relevant are the particle size distribution, the chemical composition, and the lightfastness. The charge control agent used to modify and/or stabilize the particle surface charge may be applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

Charge adjuvents may also be added. These materials increase the effectiveness of the charge control agents or charge directors. The charge adjuvent may be a polyhydroxy compound or an aminoalcohol compound, which are preferably soluble in the suspending fluid in an amount of at least 2% by weight. Examples of polyhydroxy compounds which contain at least two hydroxyl groups include, but are not limited to, ethylene glycol, 2,4,7,9-tetramethyl-decyn-4,7-diol, poly (propylene glycol), pentaethylene glycol, tripropylene glycol, triethylene glycol, glycerol, pentaerythritol, glycerol-tri-12 hydroxystearate, propylene glycerol monohydroxystearate, and ethylene glycol monohydroxystrearate. Examples of aminoalcohol compounds which contain at least one alcohol function and one amine function in the same molecule include, but are not limited to, triisopropanolamine, triethanolamine, ethanolamine, 3-amino-1 propanol, o-aminophenol, 5-amino-1-pentanol, and tetra(2-hydroxyethyl)ethylene-diamine. The charge adjuvent is preferably present in the suspending fluid in an amount of about 1 to about 100 milligrams per gram ("mg/g") of the particle mass, and more preferably about 50 to about 200 mg/g.

The surface of the particle may also be chemically modified to aid dispersion, to improve surface charge, and to improve the stability of the dispersion, for example. Surface modifiers include organic siloxanes, organohalogen silanes and other functional silane coupling agents (Dow Corning® Z-6070, Z-6124, and 3 additive, Midland, Mich.); organic titanates and zirconates (Tyzor® TOT, TBT, and TE Series, Dupont, Wilmington, Del.); hydrophobing agents, such as long chain (C12 to C50) alkyl and alkyl benzene sulphonic acids, fatty amines or diamines and their salts or quaternary derivatives; and amphipathic polymers which can be covalently bonded to the particle surface.

In general, it is believed that charging results as an acid-base reaction between some moiety present in the continuous phase and the particle surface. Thus useful materials are those which are capable of participating in such a reaction, or any other charging reaction as known in the art.

Different non-limiting classes of charge control agents which are useful include organic sulfates or sulfonates, metal soaps, block or comb copolymers, organic amides, organic zwitterions, and organic phosphates and phosphonates. Useful organic sulfates and sulfonates include, but are not limited to, bis(2-ethyl hexyl) sodium sulfosuccinate, calcium dodecyl benzene sulfonate, calcium petroleum sulfonate, neutral or basic barium dinonylnaphthalene sulfonate, neutral or basic calcium dinonylnaphthalene sulfonate, dodecylbenzenesulfonic acid sodium salt, and ammonium lauryl sulphate. Useful metal soaps include, but are not limited to, basic or neutral barium petronate, calcium petronate, Co—, Ca—, Cu—, Mn—, Ni—, Zn—, and Fe— salts of naphthenic acid, Ba—, Al—, Zn—, Cu—, Pb—, and Fe— salts of stearic acid, divalent and trivalent metal carboxylates, such as aluminum tristearate, aluminum octoate, lithium heptanoate, iron stearate, iron distearate, barium stearate, chromium stearate, magnesium octoate, calcium stearate, iron naphthenate, and zinc naphthenate, Mn— and Zn— heptanoate, and Ba—, Al—, Co—, Mn—, and Zn— Octoate. Useful block or comb copolymers include, but are not limited to, AB diblock copolymers of (A) polymers of 2-(N,N) dimethylaminoethyl methacrylate quaternized with methyl-p-toluenesulfonate and (B) poly-2-ethylhexyl methacrylate, and comb graft copolymers with oil soluble tails of poly (12-hydroxystearic acid) and having a molecular weight of about 1800, pendant on an oil-soluble anchor group of poly (methyl methacrylate-methacrylic acid). Useful organic amides include, but are not limited to, polyisobutylene succinimides such as OLOA 1200, and N-vinyl pyrrolidone polymers. Useful organic zwitterions include, but are not limited to, lecithin. Useful organic phosphates and phosphonates include, but are not limited to, the sodium salts of phosphated mono- and di-glycerides with saturated and unsaturated acid substituents.

Particle dispersion stabilizers may be added to prevent particle flocculation or attachment to the capsule walls. For the typical high resistivity liquids used as suspending fluids in electrophoretic displays, nonaqueous surfactants may be used. These include, but are not limited to, glycol ethers, acetylenic glycols, alkanolamides, sorbitol derivatives, alkyl amines, quaternary amines, imidazolines, dialkyl oxides, and sulfosuccinates.

D. Encapsulation

Encapsulation of the internal phase may be accomplished in a number of different ways. Numerous suitable procedures for microencapsulation are detailed in both *Microencapsulation, Processes and Applications*, (I. E. Vandegaer, ed.), Plenum Press, New York, N.Y. (1974) and Gutcho, *Microcapsules and Microencapsulation Techniques*, Nuyes Data Corp., Park Ridge, N.J. (1976). The processes fall into several general categories, all of which can be applied to the present invention: interfacial polymerization, in situ polymerization, physical processes, such as coextrusion and other phase separation processes, in-liquid curing, and simple/complex coacervation.

Numerous materials and processes should prove useful in formulating displays of the present invention. Useful materials for simple coacervation processes to form the capsule include, but are not limited to, gelatin, polyvinyl alcohol, polyvinyl acetate, and cellulosic derivatives, such as, for example, carboxymethylcellulose. Useful materials for complex coacervation processes include, but are not limited to, gelatin, acacia, carageenan, carboxymethylcellulose, hydrolyzed styrene anhydride copolymers, agar, alginate, casein, albumin, methyl vinyl ether co-maleic anhydride, and cellulose phthalate. Useful materials for phase separation processes include, but are not limited to, polystyrene, PMMA, polyethyl methacrylate, polybutyl methacrylate, ethyl cellulose, polyvinyl pyridine, and poly acrylonitrile. Useful materials for in situ polymerization processes include, but are not limited to, polyhydroxyamides, with aldehydes, melamine, or urea and formaldehyde; water-soluble oligomers of the condensate of melamine, or urea and formaldehyde; and vinyl monomers, such as, for example, styrene, MMA and acrylonitrile. Finally, useful materials for interfacial polymerization processes include, but are not limited to, diacyl chlorides, such as, for example, sebacoyl, adipoyl, and di- or poly- amines or alcohols, and isocyanates. Useful emulsion polymerization materials may include, but are not limited to, styrene, vinyl acetate, acrylic acid, butyl acrylate, t-butyl acrylate, methyl methacrylate, and butyl methacrylate.

Capsules produced may be dispersed into a curable carrier, resulting in an ink which may be printed or coated on large and arbitrarily shaped or curved surfaces using conventional printing and coating techniques.

In the context of the present invention, one skilled in the art will select an encapsulation procedure and wall material based on the desired capsule properties. These properties include the distribution of capsule radii; electrical, mechanical, diffusion, and optical properties of the capsule wall; and chemical compatibility with the internal phase of the capsule.

The capsule wall generally has a high electrical resistivity. Although it is possible to use walls with relatively low resistivities, this may limit performance in requiring relatively higher addressing voltages. The capsule wall should also be mechanically strong (although if the finished capsule powder is to be dispersed in a curable polymeric binder for coating, mechanical strength is not as critical). The capsule wall should generally not be porous. If, however, it is desired to use an encapsulation procedure that produces porous capsules, these can be overcoated in a post-processing step (i.e., a second encapsulation). Moreover, if the capsules are to be dispersed in a curable binder, the binder will serve to close the pores. The capsule walls should be optically clear. The wall material may, however, be chosen to match the refractive index of the internal phase of the capsule (i.e., the suspending fluid) or a binder in which the capsules are to be dispersed. For some applications (e.g., interposition between two fixed electrodes), monodispersed capsule radii are desirable.

An encapsulation technique that is suited to the present invention involves a polymerization between urea and formaldehyde in an aqueous phase of an oil/water emulsion in the presence of a negatively charged, carboxyl-substituted, linear hydrocarbon polyelectrolyte material. The resulting capsule wall is a urea/formaldehyde copolymer, which discretely encloses the internal phase. The capsule is clear, mechanically strong, and has good resistivity properties.

The related technique of in situ polymerization utilizes an oil/water emulsion, which is formed by dispersing the electrophoretic composition (i.e., the dielectric liquid containing a suspension of the pigment particles) in an aqueous environment. The monomers polymerize to form a polymer with higher affinity for the internal phase than for the aqueous phase, thus condensing around the emulsified oily droplets. In one in situ polymerization processes, urea and formaldehyde condense in the presence of poly(acrylic acid) (See, e.g., U.S. Pat. No. 4,001,140). In other processes, described in U.S. Pat. No. 4,273,672, any of a variety of cross-linking agents borne in aqueous solution is deposited around microscopic oil droplets. Such cross-linking agents include aldehydes, especially formaldehyde, glyoxal, or glutaraldehyde; alum; zirconium salts; and poly isocyanates.

The coacervation approach also utilizes an oil/water emulsion. One or more colloids are coacervated (i.e., agglomerated) out of the aqueous phase and deposited as shells around the oily droplets through control of temperature, pH and/or relative concentrations, thereby creating the microcapsule. Materials suitable for coacervation include gelatins and gum arabic. See, e.g., U.S. Pat. No. 2,800,457.

The interfacial polymerization approach relies on the presence of an oil-soluble monomer in the electrophoretic composition, which once again is present as an emulsion in an aqueous phase. The monomers in the minute hydrophobic droplets react with a monomer introduced into the aqueous phase, polymerizing at the interface between the droplets and the surrounding aqueous medium and forming shells around the droplets. Although the resulting walls are relatively thin and may be permeable, this process does not require the elevated temperatures characteristic of some other processes, and therefore affords greater flexibility in terms of choosing the dielectric liquid.

Figure 7A:
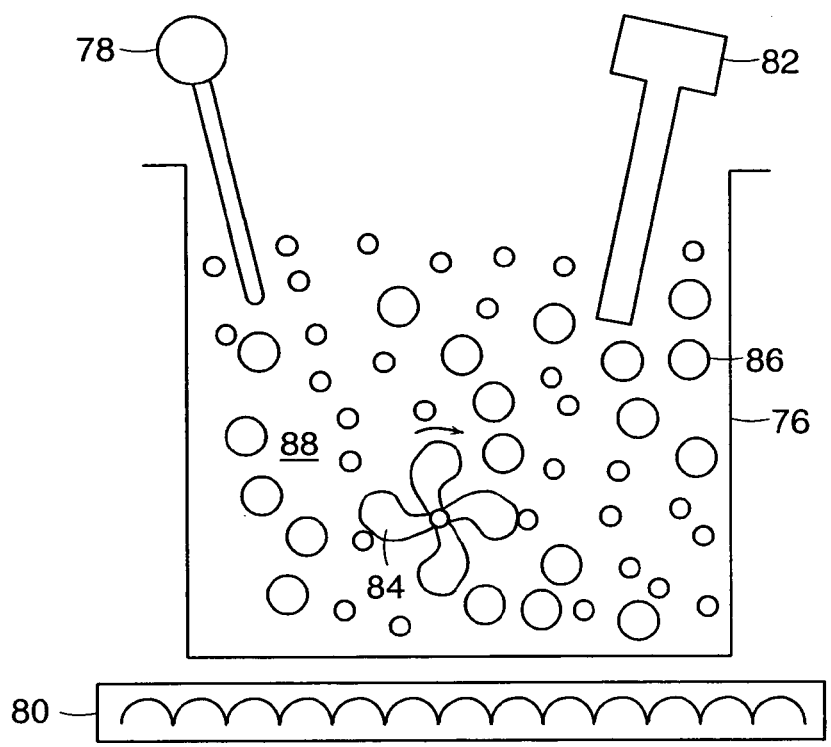
FIG. 7A is a schematic illustration of an apparatus for performing emulsion-based encapsulation.

FIG. 7A illustrates an exemplary apparatus and environment for performing emulsion-based encapsulation. An oil/water emulsion, is prepared in a vessel 76 equipped with a device 78 for monitoring and a device 80 for controlling the temperature. A pH monitor 82 may also be included. An impeller 84 maintains agitation throughout the encapsulation process, and in combination with emulsifiers, can be used to control the size of the emulsion droplets 86 that will lead to the finished capsules. The aqueous continuous phase 88 may contain, for example, a prepolymer and various system modifiers.

Figure 7B:
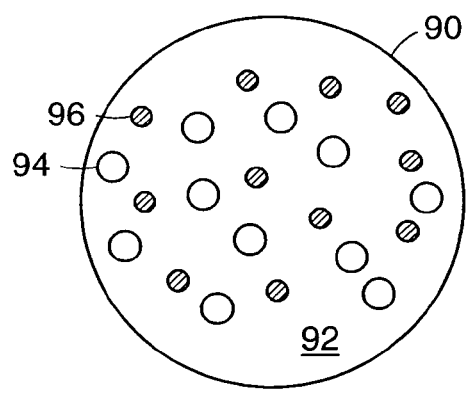
FIG. 7B is a schematic illustration of an oil drop of suspending fluid having white and black particles dispersed within it.

FIG. 7B illustrates an oil drop 90 comprising a substantially transparent suspending fluid 92, in which is dispersed white microparticles 94 and black particles 96. Preferably, particles 94 and 96 have densities substantially matched to the density of suspending fluid 92. The liquid phase may also contain some threshold/bistability modifiers, charge control agents, and/or hydrophobic monomers to effect an interfacial polymerization.

Figure 7C:
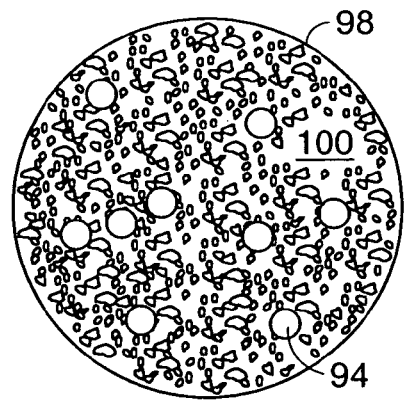
FIG. 7C is a schematic illustration of an oil drop of darkly dyed suspending fluid having white microparticles and charge control agents dispersed within it.

FIG. 7C illustrates a similar oil drop 98 comprising a darkly dyed suspending fluid 100 containing a dispersion of white particles 94 and appropriate charge control agents.

Coating aids can be used to improve the uniformity and quality of the coated or printed electrophoretic ink material. Wetting agents are typically added to adjust the interfacial tension at the coating/substrate interface and to adjust the liquid/air surface tension. Wetting agents include, but are not limited to, anionic and cationic surfactants, and nonionic species, such as silicone or fluoropolymer based materials. Dispersing agents may be used to modify the interfacial tension between the capsules and binder, providing control over flocculation and particle settling.

Surface tension modifiers can be added to adjust the air/ink interfacial tension. Polysiloxanes are typically used in such an application to improve surface leveling while minimizing other defects within the coating. Surface tension modifiers include, but are not limited to, fluorinated surfactants, such as, for example, the Zonyl® series from DuPont (Wilmington, Del.), the Fluorod® series from 3M (St. Paul, Minn.), and the fluoroakyl series from Autochem (Glen Rock, N.J.); siloxanes, such as, for example, Silwet® from Union Carbide (Danbury, Conn.); and polyethoxy and polypropoxy alcohols. Antifoams, such as silicone and silicone-free polymeric materials, may be added to enhance the movement of air from within the ink to the surface and to facilitate the rupture of bubbles at the coating surface. Other useful antifoams include, but are not limited to, glyceryl esters, polyhydric alcohols, compounded antifoams, such as oil solutions of alkyl benzenes, natural fats, fatty acids, and metallic soaps, and silicone antifoaming agents made from the combination of dimethyl siloxane polymers and silica. Stabilizers such as uv-absorbers and antioxidants may also be added to improve the lifetime of the ink.

Other additives to control properties like coating viscosity and foaming can also be used in the coating fluid. Stabilizers (uv-absorbers, antioxidants) and other additives which could prove useful in practical materials.

1. EXAMPLE 1

The following procedure describes gelatin/acacia microencapsulation for use in electrophoretic displays of the present invention.

a. Preparation of Oil (Internal) Phase

To a 1 L flask is added 0.5 g of Oil Blue N (Aldrich, Milwaukee, Wis.), 0.5 g of Sudan Red 7B (Aldrich), 417.25 g of Halogenated hydrocarbon Oil 0.8 (Halogenated hydrocarbon Products Corp., River Edge, N.J.), and 73.67 g of Isopar-G® (Exxon, Houston, Tex.). The mixture is stirred at 60° C. for six hours and is then cooled to room temperature. 50.13 g of the resulting solution is placed in a 50 mL polypropylene centrifuge tube, to which is added 1.8 g of titanium dioxide ($TiO_2$) (DuPont, Wilmington, Del.), 0.78 g of a 10% solution of OLOA 1200 (Chevron, Somerset, N.J.), in Halogenated hydrocarbon Oil 0.8, and 0.15 g of Span 85 (Aldrich). This mixture is then sonicated for five minutes at power 9 in an Aquasonic Model 75D sonicator (VWR, Westchester, Pa.) at 30° C.

b. Preparation of Aqueous Phase 10.0 g of acacia (Aldrich) is dissolved in 100.0 g of water with stirring at room temperature for 30 minutes. The resulting mixture is decanted into two 50 mL polypropylene centrifuge tubes and centrifuged at about 2000 rpm for 10 minutes to remove insoluble material. 66 g of the purified solution is then decanted into a 500 mL non-baffled jacketed reactor, and the solution is then heated to 40° C. A six-blade (vertical geometry) paddle agitator is then placed just beneath the surface of the liquid. While agitating the solution at 200 rpm, 6 g of gelatin (300 bloom, type A, Aldrich) is carefully added over about 20 seconds in order to avoid lumps. Agitation is then reduced to 50 rpm to reduce foaming. The resulting solution is then stirred for 30 minutes.

c. Encapsulation

With agitation at 200 rpm, the oil phase, prepared as described above, is slowly poured over about 15 seconds into the aqueous phase, also prepared as described above. The resulting oil/water emulsion is allowed to emulsify for 20 minutes. To this emulsion is slowly added over about 20 seconds 200 g of water that has been preheated to 40° C. The pH is then reduced to 4.4 over five minutes with a 10% acetic acid solution (acetic acid from Aldrich). The pH is monitored using a pH meter that was previously calibrated with pH 7.0 and pH 4.0 buffer solutions. Stir for 40 minutes. 150 g of water that has been preheated to 40° C. is then added, and the contents of the reactor are then cooled to 10° C. When the solution temperature reaches 10° C., 3.0 mL of a 37% formalin solution (Aldrich) is added, and the solution is further stirred for another 60 minutes. 20 g of sodium carboxymethylcellulose (NaCMC) is added, and the pH is then raised to 10.0 by the addition of a 20 wt % solution of sodium hydroxide (NaOH). The thermostat bath is then set to 40° C. and allowed to stir for another 70 minutes. The slurry is allowed to cool to room temperature overnight with stirring. The resulting capsule slurry is then ready to be sieved.

d. Formation of Display

Two procedures for preparing an electrophoretic display are from the above capsule slurry are described below.

i. Procedure Using a Urethane Binder

The resulting capsule slurry from above is mixed with the aqueous urethane binder NeoRez R-9320 (Zeneca Resins, Wilmington, Mass.) at a ratio of one part binder to 10 parts capsules. The resulting mixture is then coated using a doctor blade onto about a 100 μm to about a 125 μm thick sheet of indiun-tin oxide sputtered polyester film. The blade gap of the doctor blade is controlled at 0.18 mm so as to lay down a single layer of capsules. The coated film is then dried in hot air (60° C.) for 30 minutes. After drying, the dried film is hot laminated at 60° C. to a backplane comprising about a 100 μm to about a 125 μm thick sheet of polyester screen printed with thick film silver and dielectric inks with a pressure of 15 psi in a hot roll laminate from Cheminstruments, Fairfield, Ohio. The backplane is connected to the film using an anisotropic tape. The conductive areas form addressable areas of the resulting display.

ii. Procedure Using a Urethane/polyvinyl Alcohol Binder

The resulting capsule slurry from above is mixed with the aqueous binder comprising a mixture of NeoRez R-966 (Zeneca Resins) and a 20% solution of Airvol 203 (a polyvinyl alcohol, Airvol Industries, Allentown, Pa.) at a ratio of one part Airvol 203 solution to one part NeoRez R-966 to five parts capsules. The resulting mixture is then coated using a doctor blade onto about a 100 µm to about 125 µm thick sheet of indium-tin oxide sputtered polyester film. The blade gap of the doctor blade is controlled to 0.18 mm so as to lay down an single layer of capsules. The coated film is then dried in hot air (60° C.) for 30 minutes. After drying, a thick film silver ink is then printed directly onto the back of the dried film and allowed to cure at 60° C. The conductive areas form the addressable areas of the display.

2. EXAMPLE 2

The following is an example of the preparation of microcapsules by in situ polymerization.

In a 500 mL non-baffled jacketed reactor is mixed 50 mL of a 10 wt % aqueous solution of ethylene co-maleic anhydride (Aldrich), 100 mL water, 0.5 g resorcinol (Aldrich), and 5.0 g urea (Aldrich). The mixture is stirred at 200 rpm and the pH adjusted to 3.5 with a 25 wt % NaOH solution over a period of 1 minute. The pH is monitored using a pH meter that was previously calibrated with pH 7.0 and pH 4.0 buffer solutions. To this is slowly added the oil phase, prepared as described above in Ex. 1, and agitation is increased to 450 rpm to reduce the average particle size to less than 200 µm. 12.5 g of a 37 wt % aqueous formaldehyde solution is then added and the temperature raised to 55° C. The solution is heated at 55° C. for two hours.

3. EXAMPLE 3

The following is an example of the preparation of microcapsules by interfacial polymerization.

To 44 g of the oil phase, prepared as described above in Ex. 1, is added 1.0 g of sebacoyl chloride (Aldrich). Three milliliters of the mixture is then dispersed in 200 mL of water with stirring at 300 rpm at room temperature. To this dispersion is then added 2.5 mL of a 10 wt. % aqueous solution of 1,6-diaminohexane. Capsules form after about one hour.

E. Binder Material

The binder typically is used as an adhesive medium that supports and protects the capsules, as well as binds the electrode materials to the capsule dispersion. A binder can be non-conducting, semiconductive, or conductive. Binders are available in many forms and chemical types. Among these are water-soluble polymers, water-borne polymers, oil-soluble polymers, thermoset and thermoplastic polymers, and radiation-cured polymers.

Among the water-soluble polymers are the various polysaccharides, the polyvinyl alcohols, N-methyl Pyrollidone, N-vinyl pyrollidone, the various Carbowax® species (Union Carbide, Danbury, Conn.), and poly-2-hydroxyethylacrylate.

The water-dispersed or water-borne systems are generally latex compositions, typified by the Neorez® and Neocryl® resins (Zeneca Resins, Wilmington, Mass.), Acrysol® (Rohm and Haas, Philadelphia, Pa.), Bayhydrol® (Bayer, Pittsburgh, Pa.), and the Cytec Industries (West Paterson, N.J.) HP line. These are generally latices of polyurethanes, occasionally compounded with one or more of the acrylics, polyesters, polycarbonates or silicones, each lending the final cured resin in a specific set of properties defined by glass transition temperature, degree of "tack," softness, clarity, flexibility, water permeability and solvent resistance, elongation modulus and tensile strength, thermoplastic flow, and solids level. Some water-borne systems can be mixed with reactive monomers and catalyzed to form more complex resins. Some can be further cross-linked by the use of a crosslinking reagent, such as an aziridine, for example, which reacts with carboxyl groups.

Figure 8:
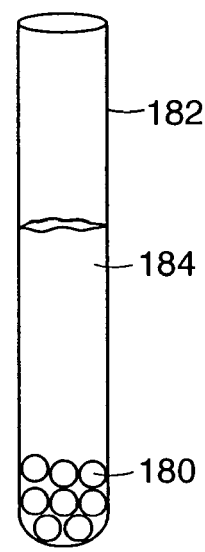
FIG. 8 schematically depicts removing water from association with capsules.

A typical application of a water-borne resin and aqueous capsules follows. A volume of particles is centrifuged at low speed to separate excess water. After a given centrifugation process, for example 10 minutes at 60× gravity ("G"), the capsules 180 are found at the bottom of the centrifuge tube 182, while the water portion 184 is at the top, as shown in FIG. 8. The water portion is carefully removed (by decanting or pipetting). The mass of the remaining capsules is measured, and a mass of resin is added such that the mass of resin is, for example, between one eighth and one tenth of the weight of the capsules. This mixture is gently mixed on an oscillating mixer for approximately one half hour. After about one half hour, the mixture is ready to be coated onto the appropriate substrate.

The thermoset systems are exemplified by the family of epoxies. These binary systems can vary greatly in viscosity, and the reactivity of the pair determines the "pot life" of the mixture. If the pot life is long enough to allow a coating operation, capsules may be coated in an ordered arrangement in a coating process prior to the resin curing and hardening.

Thermoplastic polymers, which are often polyesters, are molten at high temperatures. A typical application of this type of product is hot-melt glue. A dispersion of heat-resistant capsules could be coated in such a medium. The solidification process begins during cooling, and the final hardness, clarity and flexibility are affected by the branching and molecular weight of the polymer.

Oil or solvent-soluble polymers are often similar in composition to the water-borne system, with the obvious exception of the water itself. The latitude in formulation for solvent systems is enormous, limited only by solvent choices and polymer solubility. Of considerable concern in solvent-based systems is the viability of the capsule itself—the integrity of the capsule wall cannot be compromised in any way by the solvent.

Radiation cure resins are generally found among the solvent-based systems. Capsules may be dispersed in such a medium and coated, and the resin may then be cured by a timed exposure to a threshold level of ultraviolet radiation, either long or short wavelength. As in all cases of curing polymer resins, final properties are determined by the branching and molecular weights of the monomers, oligomers and crosslinkers.

A number of "water-reducible" monomers and oligomers are, however, marketed. In the strictest sense, they are not water soluble, but water is an acceptable diluent at low concentrations and can be dispersed relatively easily in the mixture. Under these circumstances, water is used to reduce the viscosity (initially from thousands to hundreds of thousands centipoise). Water-based capsules, such as those made from a protein or polysaccharide material, for example, could be dispersed in such a medium and coated, provided the viscosity could be sufficiently lowered. Curing in such systems is generally by ultraviolet radiation.

II. Components of a Monolayer and Processes for Display Construction in a Monolayer

A. Coating the Capsules onto a Substrate in a Monolayer

Once capsules suitable for coating onto a substrate in a monolayer are produced, the present invention also provides methods for coating those capsules in a monolayer. Generally, encapsulated electrophoretic displays include a dispersion of capsules in a polymeric binder. Alternatively, the dispersion can include capsules in a carrier (rather than binder) or capsules without a binder or carrier. The capsules contain an electrophoretically active suspension. The capsule dispersion (or "slurry") typically is coated onto a flexible polymeric substrate that may be associated with a front electrode at some point in time, achieving a monolayer of capsules. Having a binder with certain properties and/or altering a binder's physical characteristics with, for example, a change in pH or addition of a surfactant can be useful in depositing a monolayer of capsules. This resulting film is then laminated to a rear substrate. The rear substrate can be patterned in a single or multilayer electrode structure which may be printed or formed by other means on a polymeric (that can be flexible), a glass, and/or a metal substrate. While the invention is described in the context of a microencapsulated electrophoretic display, it can be relevant in the practice of any electronic display where the linking of a electrode (ie., a front surface that applies voltage to the display) to a rear electrode substrate is desired.

More particularly, after encapsulation, the capsule slurry is typically dewatered to achieve a target solids content. Dewatering, as described above, can be achieved through centrifugation, absorption, evaporation, mesh filtration, or osmotic separation. This slurry is then mixed with a binder, for example, a polymer latex (such as an aqueous polyurethane dispersion), and agitated to ensure uniform distribution of the binder material. A binder can have various fractions. A certain portion of the binder can be a solid ("binder solid"), and a certain portion of the binder can be a liquid, such as water, that is capable of evaporating. Because a binder can have more than one type of solid, the term "binder solid" can include one or more types of solid in a particular binder (i.e., the portion of solid(s) in the binder relative to other fractions in the binder). In one example, the binder typically is an aqueous dispersion of latex particles. The solid(s) can become integral with the film.

To encourage close packing of the capsules in the monolayer film, the ratio of binder solid mass to capsule mass should be kept as low as possible. Minimizing the amount of non-optically active material (such as binder) allows for good packing and results in good contrast between the white and dark state of a display. See, e.g., FIGS. 1A and 1B. However, the binder is in the film to provide structural integrity, creating a tension between desiring to reduce the amount of binder (for optical properties) and desiring to increase the amount to binder (for structural reasons). In the film, a useful ratio of binder solid mass to capsule mass is in the range of about 1:2 to about 1:20, and preferably between about 1:4 and about 1:12, and most preferably between about 1:6 and about 1:10. These metrics also apply to the polymer matrix content in a polymer-dispersed EPID.

The slurry of capsules in aqueous binder, previously prepared, is coated on a substrate as a monolayer as described below. In one example, the slurry is coated onto a polyester substrate with indium tin oxide ("ITO") disposed on the substrate, which will ultimately serve as the front transparent electrode and substrate. The substrate can be about 25 μm to about 500 μm thick. This film typically is dried at about 60° C., evaporating the aqueous phase.

1. Slot Die Method

Figure 2:
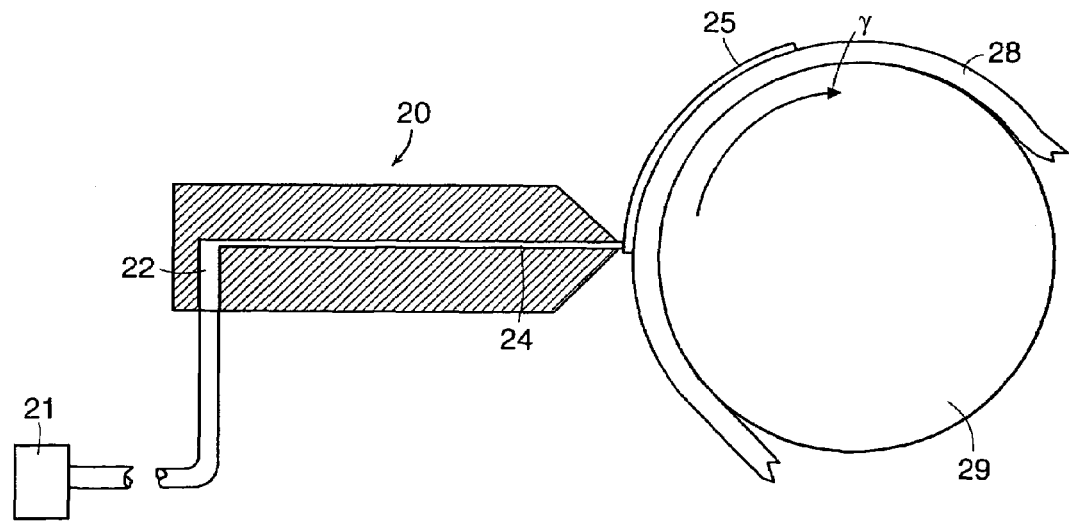
FIG. 2 schematically illustrates a coating process using a slot die coater according to one embodiment of the invention.
Figure 3:
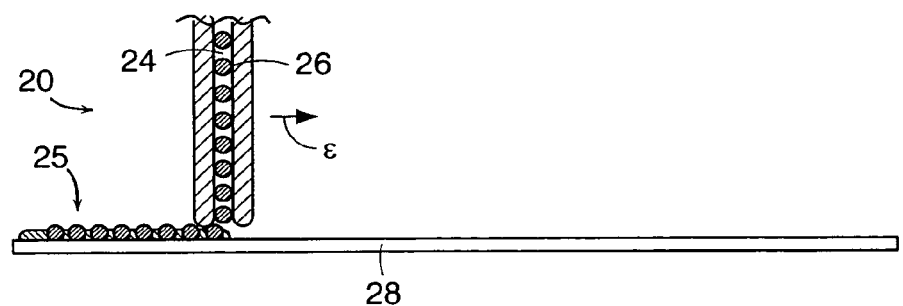
FIG. 3 schematically illustrates a slot die coater depositing a monolayer of capsules according to one embodiment of the invention.

In one coating process, a slurry of capsules in aqueous binder, previously prepared, is coated in a monolayer. The coating process involves metering the capsule/binder slurry through a slot die coating head. Referring to FIGS. 2 and 3, a head 20 attached to a pump 21 meters a constant amount of capsule/binder slurry 22 through a tightly controlled gap 24. The gap 24 allows only a single layer of capsules 26 to pass through and out of the head 20. The flow rate of the slurry can be set such that, as the head 20 moves past the receiving substrate 28 that is placed on a roller 29, a continuous monolayer 25 is formed. The substrate 28 and the head 20 are moved relative to each other. For example, the substrate is moved either linearly (not shown) or on a roll 29 (FIG. 2). The direction of movement of the roll 29 and the substrate 28 is shown as an arrow γ. Alternatively, the head 20 can be moved, typically linearly (FIG. 3). The direction of movement is shown as an arrow ε. It may be a continuous or a batch process. The capsule/binder slurry typically is deposited at a rate of about 0.1 m/min to about 100 m/min, preferably at a rate of about 0.2 m/min to about 0.7 m/min. The fluid flow can be actively controlled, for example, to start and stop coating an area. The pump 21 used to provide the metering flow can be a low shear pump, for example a peristaltic pump. A low shear pump can prevent capsule breakage during coating.

The slurry of capsules can be deposited in a monolayer by controlling the gap width to mean sphere diameter ratio. The gap/mean sphere diameter ratio is the ratio of the width of the gap through which slurry moves to the mean of capsule diameters moving through the gap. This ratio can be based on the deformability and surface properties of the spheres as well as the flow properties of the coating fluid, but in one embodiment is between about 1 and about 2.5, and preferably between about 1.2 and about 1.6. Although capsules are generally spherical during coating, they can vary slightly due to deformation during processing such that their diameter varies slightly at any given time. Thus, calculations based on the size of a capsule may vary slightly at any given time. An equation that generally relates pump rate to coating width, relative die speed, and coating thickness is as follows.

$$\text{Pump Rate} = \text{Coating Width} \times \text{Die Speed} \times \text{Coating Wet Thickness}$$

The units for these variable are $(\text{length})^3/(\text{time})$ for Pump Rate; (length) for Coating Width; (length)/(time) for Die Speed; and (length) for Coating Wet Thickness, where length and time can be measured with any appropriate unit that a user chooses. The Coating Wet Thickness tends to deviate from a particular value in a monolayer formed with large, easily deformable particles because any deformation can change the thickness slightly. Additionally, in certain situations a film that is slightly thicker than or slightly thinner than the diameter of one capsule may be desirable based on the capsule/binder ratio, how the capsules actually deform into a film, and/or the presence of any interstitial void, and the like. For example, the more compliant and/or resilient a capsule is, the thinner the film can be. The less compliant and/or resilient a capsule is, the thicker the film can be. However, once a film thickness is determined (e.g., empirically), a change in Die Speed or Coat Width will relate directly to the equation above.

2. Air Knife Method

In another embodiment of the present invention, an air knife coater forms an encapsulated electrophoretic display having a monolayer of capsules. Air knife coating has been used in a variety of coating applications, including carbonless paper and electroluminescence coatings, which both contain encapsulated materials. The use of an air knife in these applications is, however, used for thickness control, and is not used for forming a stable, durable monolayer of capsules.

Figure 4:
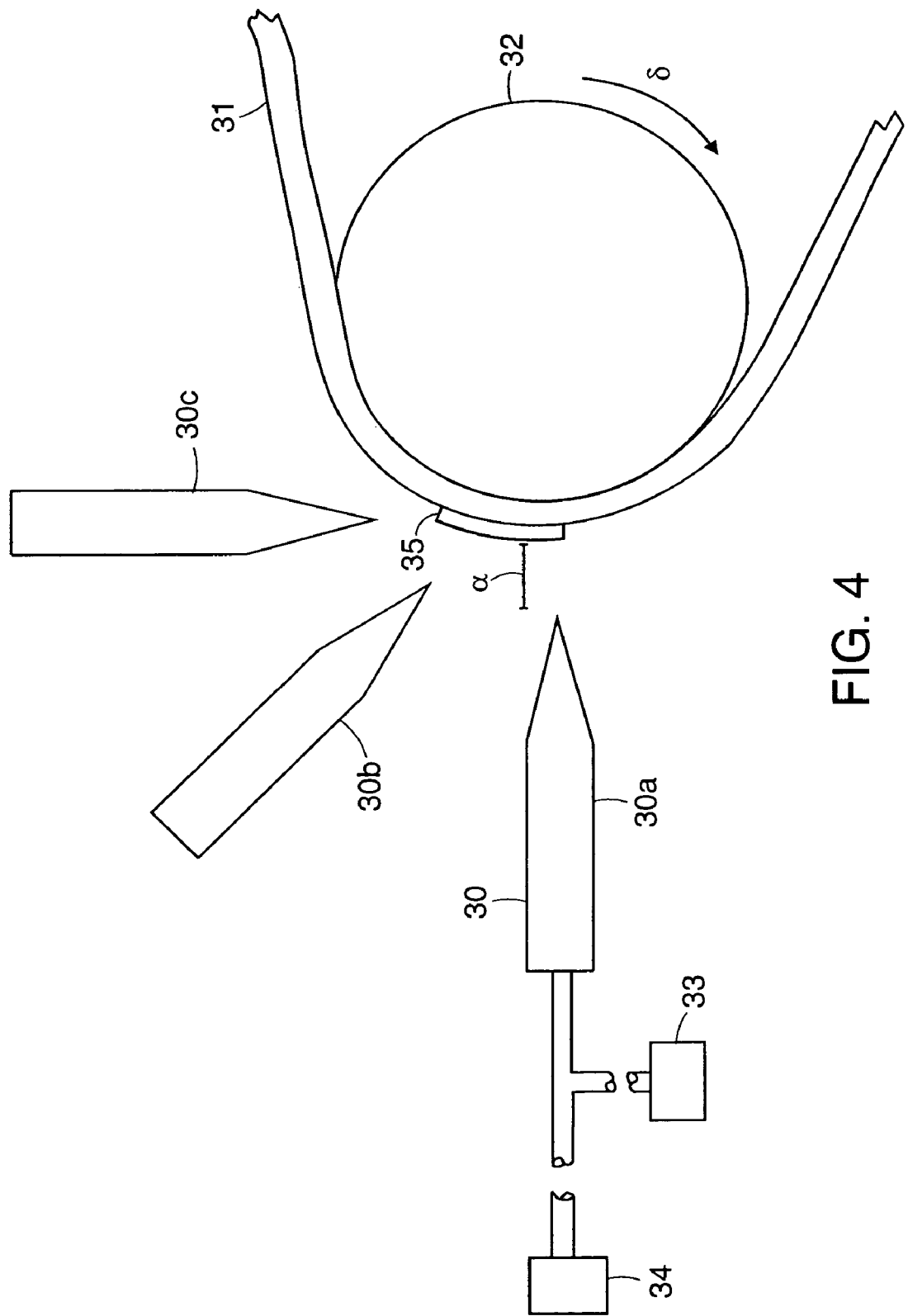
FIG. 4 schematically illustrates a coating process using an air knife coater according to one embodiment of the invention.

In methods of the present invention, a capsule slurry is applied to a substrate, which is either moving or still, by applying pressure so that the capsules in the slurry form a monolayer on the substrate. A substrate can be a conductive material such as ITO sputtered polyester. The pressure is applied to the mixture with a pressurized gas, typically air. An air knife can be used to apply the pressure so as to uniformly distribute the slurry. Referring to FIG. 4, an air knife 30 is held at a distance of from about 1 cm to about 15 cm (distance α) from the surface of the slurry 35. The slurry is provided on a surface of a substrate 31 and moves in a direction δ by a coating roll 32. The air knife 30 is held at an angle of from about 0° to about 90° (e.g., shown in FIG. 4 are three positions of the air knife 30a, 30b, 30c, although many more positions are possible) from the surface of the slurry 35. A pressure source 34 provides pressure to the air knife 30. If conditions, such as gas pressure, distance from slurry, angle relative to the slurry, slurry viscosity, and relative speed between the air knife and the substrate on which the slurry is deposited are optimized, a monolayer can be formed. For example, the air knife can remove excess slurry as well as create a monolayer of capsules. When an air knife is used in conjunction with controlled amounts of capsule slurry, waste of the slurry can be limited. Also, because the air knife does not touch the slurry, the probability of scratching the substrate or breaking the capsules is reduced.

The gas being blown over the coating material can be other than air at ambient temperature. The gas may be heated or cooled, changing the coatability and viscosity properties of the capsule slurry. The gas may be blown on wet (e.g., a liquid in droplets) or dry, controlling evaporation of solvents in the capsule slurry. Temperature or addition of liquids can be controlled, for example, with a heater, refrigeration unit, liquid pump, and/or other devices known to those skilled in the art, as represented by a controller 33 in FIG. 4. The gas may be mixed with solvents that help cure the capsule slurry and/or make the slurry easier to coat onto the substrate. The solvent is chosen to be compatible with the substrate layer. For example, if the substrate is water-based, the solvent can be water or an alcohol. Useful alcohols include isopropyl alcohol, methanol, and ethanol. If the substrate is organic, a compatible organic solvent can be mixed with the gas. For example, a butyl acetate substrate is coated with "acetate humidified" air. Other useful organic solvents for use in methods of the invention include methylene chloride and chlorobenzene. In certain embodiments, the suspending fluid inside the capsule is a halogenated hydrocarbon, such as tetrachloroethylene or poly(chlorotrifluoroethylene). Also, the evaporative binder in certain embodiments can be, for example, a polymer latex, an acrylic, urethane, poly(vinyl alcohol), or water-based binder.

3. Coating With Substantially No Binder

Figure 9A:
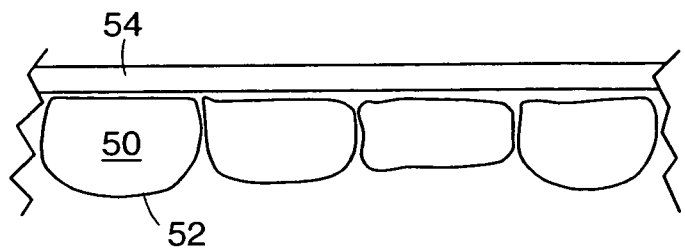
FIG. 9A is a schematic illustration of a film without binder prior to contact with a layer of material to fill the interstices within the film.

In certain situations, it may be desirable to coat capsules onto a substrate substantially in the absence of a binder. For example, and referring to FIG. 9A, a capsule 50 has a capsule wall 52 that is constructed from a polymer. For example, the capsule can be formed from gelatin/acacia, as described above. The capsule wall 52 is heavily swelled with water and/or a polar solvent. For example, about 1% to about 90%, preferably about 5% to about 20%, of the capsule wall 52 can be formed from the polymer while about 10% to about 99%, preferably about 80% to about 95% can be formed from the water and/or polar solvent. These capsules 50 are coated onto a substrate 54, as described above for the slurry. The capsules 52 can be suspended in a carrier such as water or not suspended in any carrier. As the capsules 50 are dried, for example, at 60° C., the water and/or polar solvent evaporates from the capsule walls 52 of the capsules 50 in the coated monolayer. As the water and/or polar solvent evaporates, the capsule walls 52 intermingle with, associate with, and/or adhere to each other and/or the substrate 54. A film is formed. Without a binder in the film, capsules can deform to a greater degree than with binder in the film, in some situations.

B. Laminating the Rear Substrate

Once a capsule slurry is coated onto a front electrode on a flexible or rigid substrate (e.g., a polymeric material or glass), achieving a monolayer of microcapsules, this coated film is then laminated to a rear substrate (alternatively know as a "backplane"). The rear substrate can be, for example, a polymeric material (that can be flexible), glass, or metal. The rear substrate can be patterned in a single or multi-layer electrode structure which may be printed or formed by other means on a second flexible polymeric substrate. While the present invention is described in the context of an encapsulated display, it can be relevant in the practice of any electronic display for linking a front active surface to a rear electrode substrate (either with or without additional layers between the front surface and rear substrate).

Lamination, typically, occurs under vacuum conditions and involves the application of heat and/or pressure. For example, temperatures from about 40° C. to about 150° C. and more preferably from about 50° C. to about 120° C. can be used, depending upon the lamination procedure and/or laminate material that is used. A typical rear substrate is constructed from a base substrate either with or without an electrode layered on the base substrate. One example of a rear substrate is a polyester or polyimide base film and a set of patterned electrodes. Generally, these electrodes are a single- or multi-layer conductor/insulator stack that can printed on the substrate. The substrates can be a polymeric material (which can be flexible), glass, or a metal. Typically, the conductors are conductive particles (e.g., carbon, silver, palladium, tin oxide, doped tin oxide, copper), doped polyesters, and vinyls which are screen printed and heat cured. Furthermore, a rear substrate can have transistors (organic and/or silicon-based), diodes, and/or electrodes disposed on the substrate.

Figure 5A:
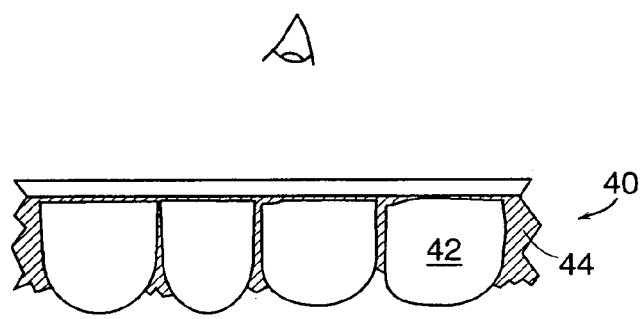
FIG. 5A is a schematic illustration of a film prior to contact with a layer of material to fill the interstices within the film.

The film can be combined with the rear substrate in a variety of ways. Typically, the film 40, after being coated as a monolayer, contains voids and irregularities in the binder 44 between the capsules 42, irregular surfaces on the capsules 42, and/or irregular surfaces at the edge of the binder 44, as shown in FIG. 5A. As discussed above, the binder level in the slurry is kept as low as possible to maximize optically active area, leaving little binder to flow and absorb the stresses of lamination. The capsule wall bears the majority of these stresses, which can result in capsule breakage. Additionally, with no material filling the voids between capsules as well as voids in other areas such as the surface of the capsules or edge of the binder, the laminated product may have trapped air, or trapped vacuum packets, which can both change the mechanical stresses experienced by the film and affect the electrical characteristics (which may result in non-uniform switching).

Figure 5B:
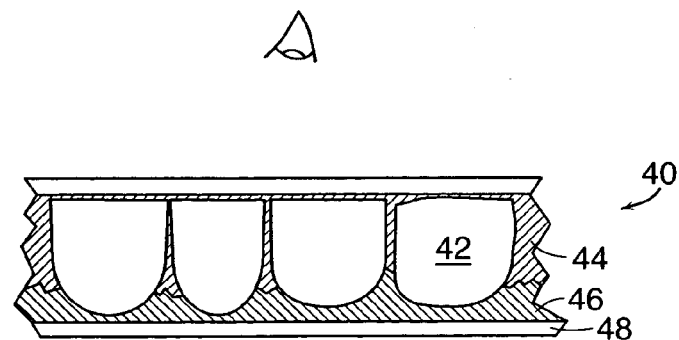
FIG. 5B is a schematic illustration of the film of FIG. 5A after the layer of material has been applied and laminated to a rear substrate.
Figure 9B:
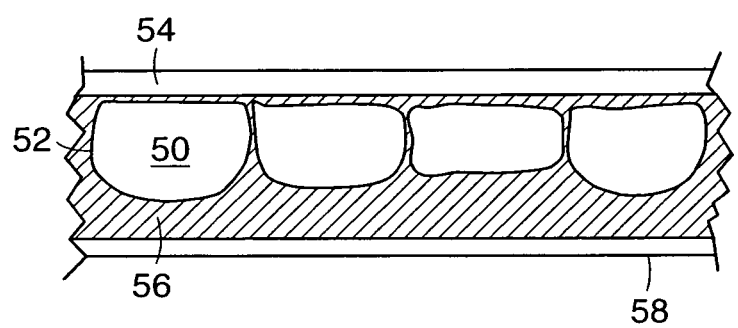
FIG. 9B is a schematic illustration of the film of FIG. 9A after the layer of material has been applied and after lamination to a rear substrate.

In one embodiment, an additional layer of material can be included between the film and the rear substrate to address the problem above. This layer of material can be an adhesive which can flow at the lamination temperature. The layer also may be tacky. For example, it may be a polymeric material identical or similar to that of the binder material coated onto the front substrate previously, or it may be a hotmelt adhesive sheet, which could be thermoplastic or thermoset. Alternatively, it may be a material which is initially in liquid form at room temperature but forms a solid matrix after curing or crosslinking. These solutions provide a flowable material which can fill in any voids between capsules and smooth out the roughness of the rear capsule surface during the lamination process without putting undue stresses on the capsule walls themselves. Such a final result can be seen in FIG. 5B. The additional layer of material 46 has filled the interstices (including, but without limitation, the voids between the capsules 42, the irregular surfaces of the binder 44 and the irregular surfaces of capsules 42) and adheres to a rear substrate 48. The additional layer of material 46 can be initially coated onto the film 40 (i.e., the rear of the capsules) or onto the rear substrate 48, before the lamination procedure, or the layer 46 can be a hotmelt adhesive sheet (which can be thermoplastic or thermoset) introduced between the film and rear substrate during the lamination procedure. The more uniformly sized the capsules are and/or the more monodisperse (i.e., the more like a perfect monolayer) the capsules are, the thinner the additional layer of material can be because such conditions produce a more uniform film that includes fewer interstices and the like. Uniform capsule sizes and distributions can be obtained as described above. The additional layer of material can be about 50 µm or less in thickness. Typically, this layer and/or the capsules and/or the substrate forms a uniformly thick stratum. The stratum can be between about 10 µm thick and about 500 µm thick, preferably about 50 µm thick to about 300 µm thick. Alternatively, certain capsules can be used without a binder, as described above. In that case, and referring to FIG. 9B, a final structure can be formed in which the interstices and irregular surfaces of capsules 50 on a substrate 54 are filled with a layer of material 56 that is adjacent a rear substrate 58.

If the layer of material is initially coated on to the front film, it can substantially planarize the capsule film facing the rear substrate and/or provide a tacky surface to enable lamination to the rear substrate. Thus, the capsule film is planar prior to lamination, and tacky front and rear substrates do not need to be stored separately, because only the front substrate is tacky. Additionally, a front film need not have a rear substrate. For example, a film that has been planarized with the layer of material can be operated with a stylus. This can occur with or without a rear substrate, and the layer of material need not be tacky if no rear substrate is used.

A semiconducting or anisotropically conducting adhesive can be used as the additional layer. This material will conduct an electric field from the backplane to the capsules with little loss of field strength. An adhesive containing carbon particles, gold particles, aluminum particles, platinum particles, silver particles, plated polymer spheres, plated glass spheres, or ITO particles may be used. Also, conductive polymers such as polyacetylene, polyaniline, polypyrrole, P-DOT, or polythiophene can be used to dope the additional layer of material, causing it to conduct well in the Z-axis but not in the plane of the adhesive. Thus, the electric field is more efficiently transmitted to the capsules. In order to make these films, the adhesive sheet can be cast and then stretched in one or both axes. The resistivity of the layer of material can be about $10^5$ to about $10^{15}$ ohm·cm, more preferably about $10^8$ to about $10^{13}$ ohm-cm. Additionally, an insulating layer of material can be used.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A process for creating an encapsulated electrophoretic element having a plurality of capsules disposed on a substrate in substantially a single layer, the process comprising the steps of:
   (a) providing the capsules;
   (b) mixing capsules with a binder to create a capsule/binder mixture;
   (c) coating the capsule/binder mixture onto an at least partially conductive substrate, thereby to create a film comprising the capsules in substantially a single layer; and
   (d) curing the capsule/binder mixture.

2. The process of claim 1 wherein the binder is selected from the group consisting of acrylic, urethane, and poly (vinyl alcohol).

3. The process of claim 1 wherein the binder comprises a polymer latex.

4. The process of claim 1 wherein a fraction of the binder is capable of evaporating and the step of curing the mixture comprises evaporating the fraction of the binder.

5. The process of claim 1 wherein the substrate comprises an indium tin oxide sputtered polyester film.

6. The process of claim 1 wherein at least one of the capsules contains a plurality of particles dispersed in a suspending fluid.

7. The process of claim 1 wherein the coating step comprises applying pressurized gas to the capsule/binder mixture, thereby to cause deposition of the capsule/binder mixture onto the substrate such that the capsules are disposed on the substrate in substantially a single layer.

8. The process of claim 7 further comprising heating the pressurized gas to a temperature higher than an ambient temperature prior to applying the pressurized gas to the capsule/binder mixture.

9. The process of claim 7 further comprising cooling the pressurized gas to a temperature lower than an ambient temperature prior to applying the pressurized gas to the capsule/binder mixture.

10. The process of claim 7 further comprising adding a liquid to the pressurized gas.

11. The process of claim 10 wherein the liquid comprises at least one droplet.

12. The process of claim 10 wherein the liquid comprises an organic solvent.

13. The process of claim 12 wherein the organic solvent comprises an alcohol.

14. The process of claim 7 wherein the coating step comprises applying the pressurized gas with an air knife.

15. The process of claim 7 wherein the pressurized gas is applied from a distance of about 1 cm to about 15 cm from the surface of the capsule/binder mixture.

16. The process of claim 7 wherein the pressurized gas is applied at an angle of from 0 degrees to 90 degrees from the surface of the conductive substrate.

17. The process of claim 1 wherein the coating step comprises coating at least some of the capsules onto the substrate through a coating head comprising a slot die coating head.

18. The process of claim 17 wherein a width of a slot of the slot die coating head is between about 1 and about 2.5 times the mean diameter of the capsules.

19. The process of claim 1 further comprising laminating the film with a rear substrate.

20. The process of claim 19 wherein a layer of material is disposed between the film and the rear substrate.

21. The process of claim 20 wherein the layer of material is associated with the rear substrate prior to laminating.

22. The process of claim 20 wherein the layer of material is associated with the film prior to laminating.

23. The process of claim 19 wherein heating occurs during the step of laminating.

24. The process of claim 19 wherein pressurizing occurs during the step of laminating.

25. The process of claim 19 wherein evacuating of a gas occurs during the step of laminating.

26. The process of claim 20 wherein the layer of material comprises an insulator.

27. The process of claim 20 wherein the layer of material comprises a conductor.

28. The process of claim 20 wherein the layer of material comprises a semiconductor.

29. The process of claim 20 wherein the layer of material is in a liquid state during at least a portion of the laminating step.

30. The process of claim 20 wherein the layer of material comprises the binder.

31. The process of claim 20 wherein the step of laminating produces a stratum comprising the capsules, the binder, and the layer of material and having at least one substantially planar side proximate the rear substrate.

32. The process of claim 20 wherein the step of laminating produces a stratum comprising the capsules, the binder, and the layer of material, the stratum being substantially free from voids.

33. The process of claim 20 wherein the layer of material has a thickness of less than or equal to about 50 μm.

* * * * *